US012484256B2

(12) United States Patent
Moon et al.

(10) Patent No.: US 12,484,256 B2
(45) Date of Patent: Nov. 25, 2025

(54) THIN FILM TRANSISTOR ARRAY, FABRICATION METHOD THEREOF, AND DISPLAY APPARATUS COMPRISING THE THIN FILM TRANSISTOR

(71) Applicant: LG DISPLAY CO., LTD., Seoul (KR)

(72) Inventors: KyeongJu Moon, Paju-si (KR); Seunghyo Ko, Paju-si (KR); Nuri On, Paju-si (KR)

(73) Assignee: LG Display Co., Ltd (KR)

( * ) Notice: Subject to any disclaimer, the term of this patent is extended or adjusted under 35 U.S.C. 154(b) by 540 days.

(21) Appl. No.: 17/897,803

(22) Filed: Aug. 29, 2022

(65) Prior Publication Data

US 2023/0070485 A1  Mar. 9, 2023

(30) Foreign Application Priority Data

Sep. 3, 2021 (KR) .................. 10-2021-0117837
Jan. 1, 2022 (KR) .................. 10-2022-0000007

(51) Int. Cl.
| | | |
|---|---|---|
| H10D 30/67 | (2025.01) | |
| H10D 30/01 | (2025.01) | |
| H10D 62/86 | (2025.01) | |
| H10D 86/40 | (2025.01) | |
| H10D 86/60 | (2025.01) | |

(52) U.S. Cl.
CPC ....... H10D 30/6755 (2025.01); H10D 30/031 (2025.01); H10D 62/86 (2025.01); H10D 86/423 (2025.01); H10D 86/427 (2025.01); H10D 86/60 (2025.01)

(58) Field of Classification Search
None
See application file for complete search history.

(56) References Cited

U.S. PATENT DOCUMENTS

2018/0175077 A1* 6/2018 Koo .................. H10K 59/126
2021/0408292 A1* 12/2021 Sohn ................ H10D 30/6755

FOREIGN PATENT DOCUMENTS

KR  20180070334 A  6/2018
KR  20200076343 A  6/2020

OTHER PUBLICATIONS

Office Action in Korean Appln. No. 10-2022-0000007, mailed on Jul. 31, 2025, 14 pages (with English translation).

* cited by examiner

*Primary Examiner* — Daniel Whalen
(74) *Attorney, Agent, or Firm* — Fish & Richardson P.C.

(57) ABSTRACT

A thin film transistor includes an active layer of an oxide semiconductor, a gate electrode provided on or under the active layer while being spaced apart from the active layer and overlapping with at least a portion of the active layer, and a gate insulating film between the active layer and the gate electrode, wherein the active layer includes copper (Cu).

17 Claims, 23 Drawing Sheets

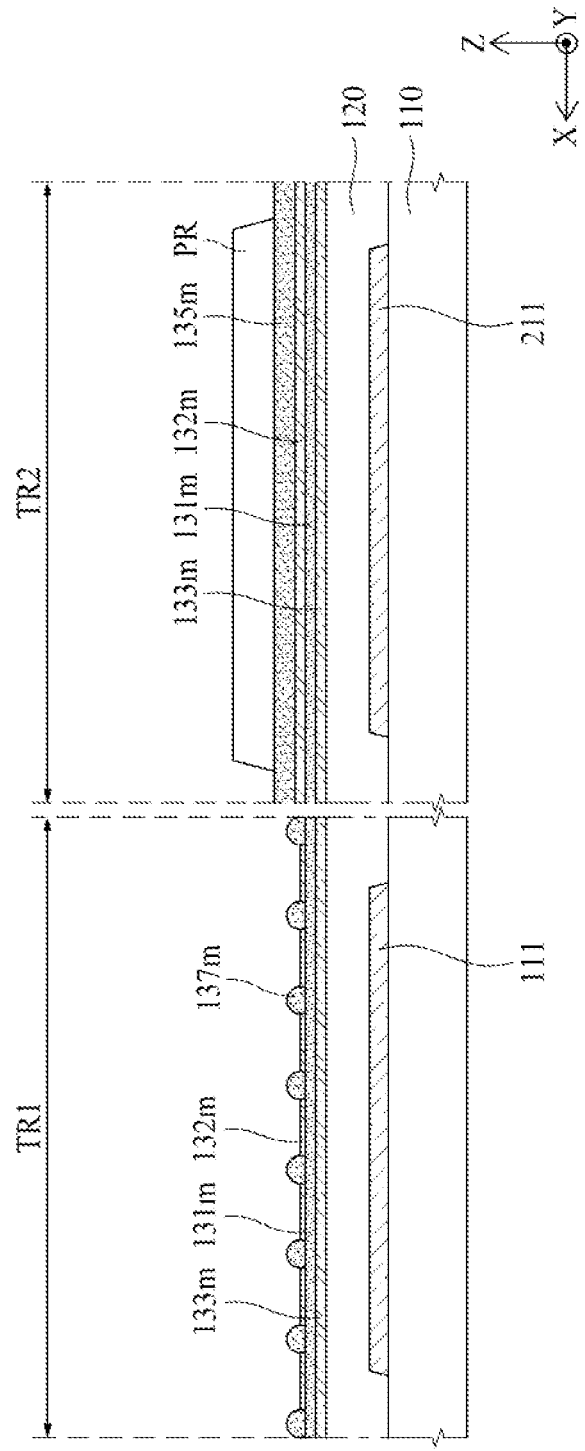

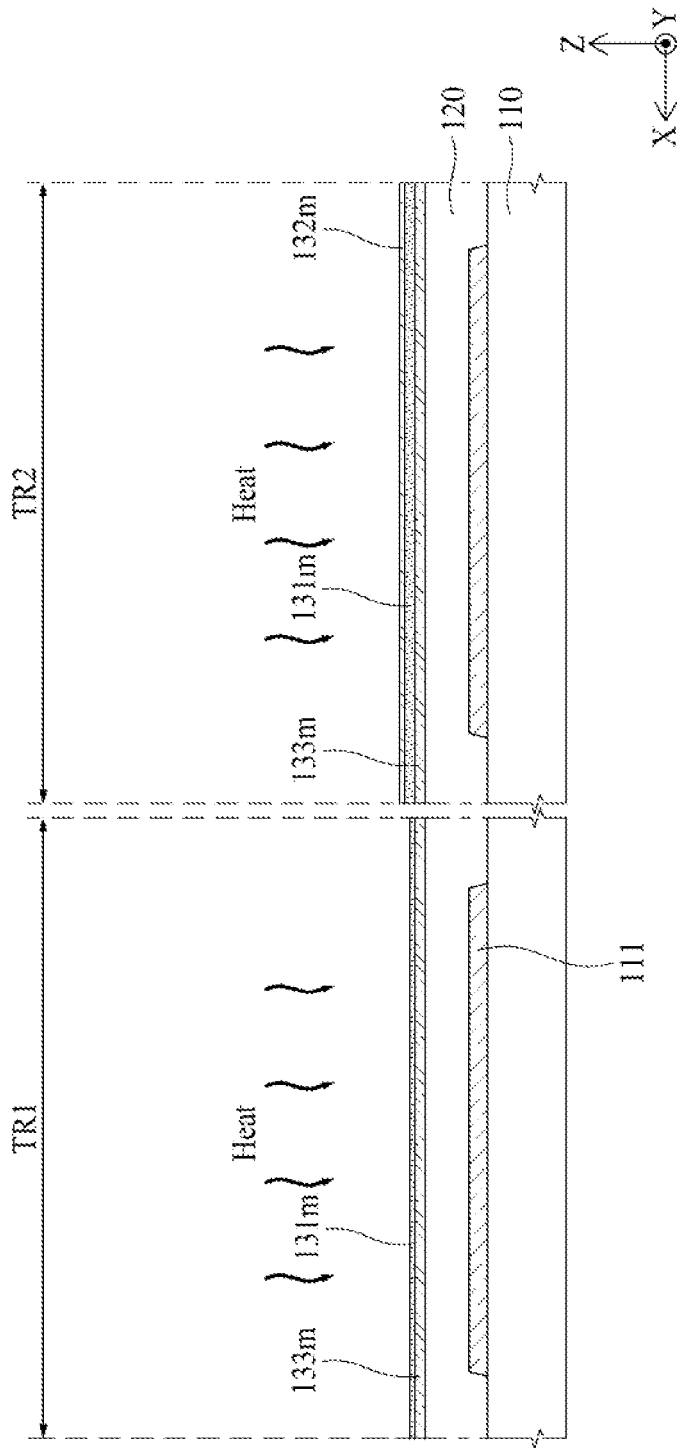

THIN FILM TRANSISTOR ARRAY, FABRICATION METHOD THEREOF, AND DISPLAY APPARATUS COMPRISING THE THIN FILM TRANSISTOR

CROSS-REFERENCE TO RELATED APPLICATIONS

This application claims the priorities of Korean Patent Application No. 10-2021-0117837 filed on Sep. 3, 2021 and Korean Patent Application No. 10-2022-0000007 filed on Jan. 1, 2022, which are hereby incorporated by reference in their entirety.

BACKGROUND

Field of the Disclosure

The present disclosure relates to a thin film transistor, a thin film transistor array, a fabrication method thereof, and a display apparatus comprising the thin film transistor.

Description of the Background

According to a material constituting an active layer, a thin film transistor may be divided into an amorphous silicon thin film transistor using an active layer of amorphous silicon, a polycrystalline silicon thin film transistor using as an active layer of polycrystalline silicon, and an oxide semiconductor thin film transistor using as an active layer of oxide semiconductor.

According as the oxide semiconductor thin film transistor TFT have a large resistance change according to the content of oxygen, it facilitates obtaining the desired physical properties. Also, since the oxide constituting the active layer becomes a thin film at a relatively low temperature for a fabrication process of the oxide semiconductor thin film transistor, a manufacturing cost is low. The oxide semiconductor is transparent owing to the properties of the oxide, whereby it is favorable to a realization of a transparent display apparatus.

Preferably, a thin film transistor used as a driving device of a display apparatus has a large S-factor for a grayscale representation. Therefore, it necessarily requires a study for securing a large S-factor in a thin film transistor used as a driving device of a display apparatus. A thin film transistor used as a switching device is advantageous in that it has a relatively low S-factor and a high on-current $I_{on}$ value compared to a thin film transistor used as a driving device. Therefore, there is a need for a study for adjusting the required electrical characteristics of the thin film transistor through a simple process.

SUMMARY

Accordingly, the present disclosure is to provide a thin film transistor capable of adjusting an S-factor, a mobility, a threshold voltage, and an on-current $I_{on}$ value with easiness, a display apparatus comprising the same, and a fabrication method of the thin film transistor array.

The present disclosure is also to provide a thin film transistor capable of adjusting the electrical characteristics thereof.

The present disclosure is also to provide a method of improving an S-factor in a thin film transistor by forming a defect state in an active layer, and a thin film transistor having a large S-factor by a defect state included in a surface of an active layer.

The present disclosure is also to provide a thin film transistor array with the electrical characteristics adjusted owing to a defect state at the interface by selectively applying copper Cu to an active layer of a single-layered structure or a multi-layered structure, and a fabrication method of the thin film transistor array.

The present disclosure is also to provide a method of forming a defect state at the interface between an active layer and an inorganic insulating layer by providing copper Cu ions in a surface of an active layer comprised of a first oxide semiconductor layer and applying a heat treatment thereto.

The present disclosure is also to provide a thin film transistor including an active layer formed by providing copper Cu ions in a surface of an active layer comprised of a first oxide semiconductor layer and applying a heat treatment thereto.

The present disclosure is also to provide a thin film transistor having a first oxide semiconductor layer including copper Cu ions disposed in a surface.

The present disclosure is also to provide a display apparatus including a driving thin film transistor with a large S-factor to represent great grayscale.

In an aspect of the present disclosure, a thin film transistor includes an active layer of an oxide semiconductor, a gate electrode provided on or under the active layer while being spaced apart from the active layer and overlapping with at least a portion of the active layer, and a gate insulating film between the active layer and the gate electrode, wherein the active layer includes copper Cu.

In another aspect of the present disclosure, a display apparatus includes the above thin film transistor.

In another aspect of the present disclosure, a thin film transistor array includes a first thin film transistor and a second thin film transistor on a substrate, wherein the first thin film transistor includes a first active layer on the substrate, and a first gate electrode spaced apart from the first active layer and overlapping with at least a portion of the first active layer, and wherein the second thin film transistor includes a second active layer on the substrate, and a second gate electrode space apart from the second active layer and overlapping with at least a portion of the second active layer, wherein the first active layer includes a first main active layer, the first main active layer includes a first carrier acceptor, the second active layer includes a second main active layer, and a second interface layer on the second main active layer, and the second interface layer includes a second carrier acceptor.

In aspect of the present disclosure, a fabrication method of a thin film transistor array includes preparing a substrate including a first area and a second area, forming a main active material layer on the substrate, forming an interface material layer on the main active material layer, forming a carrier acceptor material layer on the interface material layer, removing at least a portion of the interface material layer of the first area and the carrier acceptor material layer of the first area, removing the carrier acceptor material layer of the second area, and forming a first active layer on the first area and a second active layer on the second area by patterning the main active material layer and the interface material layer, wherein the first active layer includes a first main active layer, and the first main active layer includes a first carrier acceptor, the second active layer includes a second main active layer, and a second interface layer on the second main active layer, and the second interface layer includes a second carrier acceptor.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will be more clearly understood from the following detailed description taken in conjunction with the accompanying drawings, in which:

FIGS. 7A to 7F illustrate a fabrication method of the thin film transistor array according to the aspect of the present disclosure;

DETAILED DESCRIPTION

Figure 1:
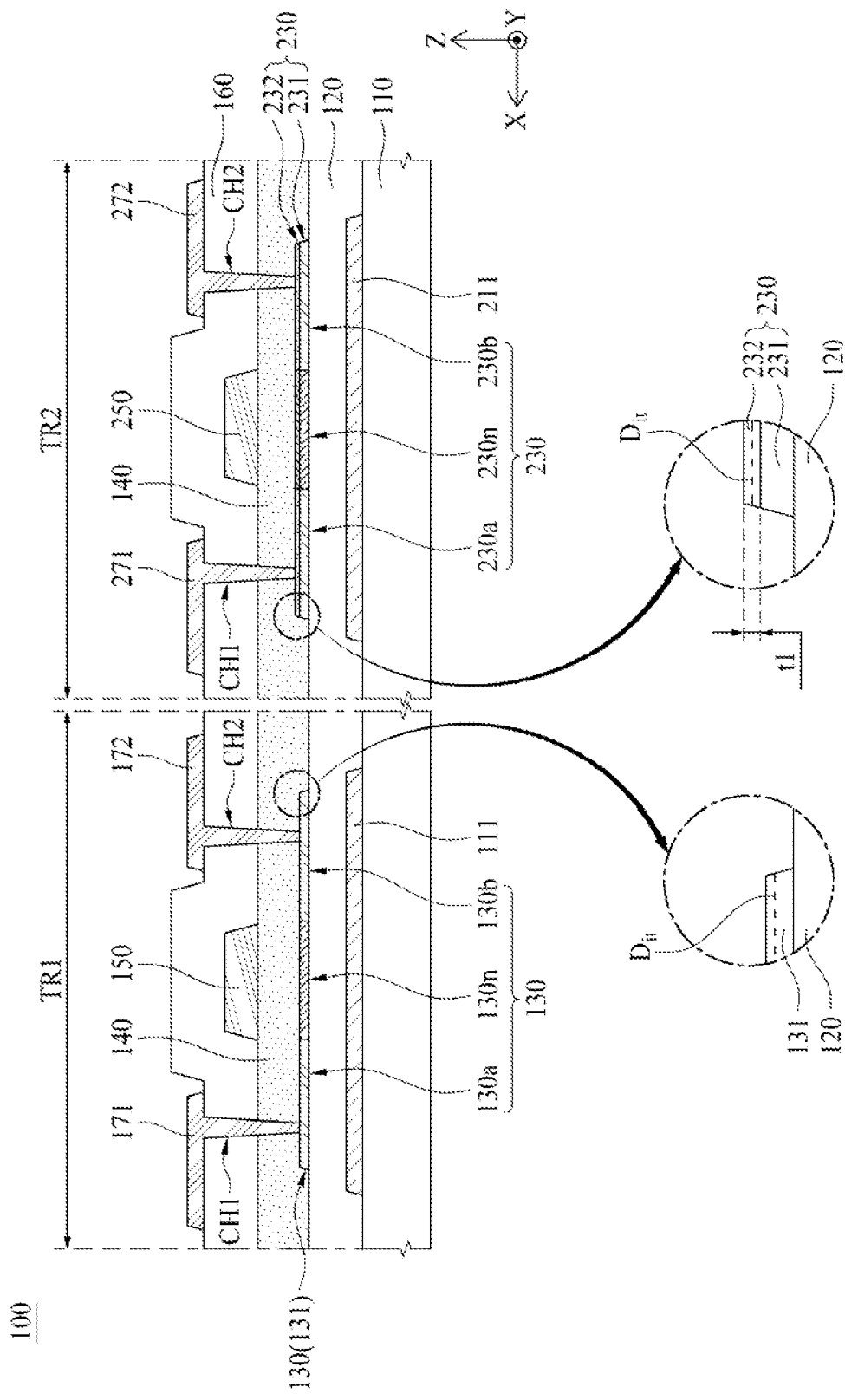
FIG. 1 is a cross-sectional view of a thin film transistor array according to an aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

In the drawings, the same or similar elements are denoted by the same reference numerals even though they are depicted in different drawings.

In the aspects of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In one or more aspects of the present disclosure, for convenience of explanation, a source region is distinguished from a source electrode, and a drain region is distinguished from a drain electrode. However, aspects of the present disclosure are not limited to this structure. For example, a source region may be a source electrode, and a drain region may be a drain electrode. Also, a source region may be a drain electrode, and a drain region may be a source electrode.

FIG. 1 is a cross sectional view of a thin film transistor array according to the aspect of the present disclosure.

The thin film transistor array 100 according to the aspect of the present disclosure includes a substrate 110, a first thin film transistor TR1 on the substrate 110, and a second thin film transistor TR2 on the substrate 110.

An active layer 130 of the first thin film transistor TR1 of the thin film transistor array 100 according to the aspect of the present disclosure is formed of a single oxide semiconductor layer 131, and an active layer 230 of the second thin film transistor TR2 may be formed of double oxide semiconductor layers 231 and 232.

A thickness of the active layer 130 of the first thin film transistor TR1 of the thin film transistor array 100 according to the aspect of the present disclosure may be smaller than a thickness of the active layer 230 of the second thin film transistor TR2.

The first thin film transistor TR1 includes the active layer 130 having a channel portion 130n, a first connection portion 130a, and a second connection portion 130b, a gate insulating film 140 on the active layer 130, a gate electrode 150 on the gate insulating film 140, a first electrode 171 connected to the first connection portion 130a, and a second electrode 172 connected to the second connection portion 130b.

Hereinafter, the thin film transistor array 100 according to one aspect of the present disclosure will be described in detail.

The substrate 110 may be a glass substrate, a curable or bendable thin film glass substrate, a plastic substrate, or a silicon wafer substrate. If using plastic for the substrate 110, transparent plastic having flexibility, for example, polyimide may be used. If the substrate 110 is formed of polyimide, heat resistant polyimide capable of enduring a high temperature may be used in consideration of a high temperature deposition process on the substrate 110.

Then, light shielding layers 111 and 211 may be disposed on the substrate 110. The light shielding layers 111 and 211 may be disposed while being overlapping with respective predetermined areas including the active layers 130 and 230 of the first thin film transistor TR1 and the second thin film transistor TR2.

The light shielding layers 111 and 211 may be made of a material having the light blocking characteristics or light reflection characteristics. The light shielding layers 111 and 211 may be formed in a single-layered structure or a multi-layered structure made of metal such as molybdenum (Mo), aluminum (Al), chromium (Cr), gold (Au), titanium (Ti), nickel (Ni), neodymium (Nd), and silver (Ag), or an alloy thereof. However, it is not limited to these materials, and the light shielding layers 111 and 211 may be formed of various materials generally known to those in the art. The light shielding layers 111 and 211 may include a lower light shielding layer and an upper light shielding layer, and may block external light from the outside, to thereby protect the active layers 130 and 230. The light shielding layers 111 and 211 may not be disposed on a whole surface of the substrate 110, but may be disposed on at least a portion overlapping the thin film transistor 100.

A buffer layer 120 may be commonly disposed on the substrate 110 and the light shielding layers 111 and 211 of the first thin film transistor TR1 and the second thin film transistor TR2.

The buffer layer 120 may be formed of a multi-layer by stacking one or more inorganic films of a silicon oxide (SiOx) film, a silicon nitride (SiN) layer, and a silicon oxynitride (SiON) layer. Other components of the thin film transistors TR1 and TR2 including the active layers 130 and 230, which will be described later, may be disposed on the buffer layer 120.

The active layers 130 and 230 may be disposed on the buffer layer 120.

The active layer 130 of the first thin film transistor TR1 may be disposed to overlap with the first gate electrode 150 of the first thin film transistor TR1, and first and second electrodes 171 and 172. The active layer 130 includes a channel portion 130n, a first connection portion 130a, and a second connection portion 130b. The first connection portion 130a contacts one side of the channel portion 130n, and the second connection portion 130b contacts the other side of the channel portion 130n.

The first connection portion 130a and the second connection portion 130b of the first thin film transistor TR1 may be formed by selective conduction of the active layer 130. The first connection portion 130a and the second connection portion 130b may be referred to as conductor portions. In the thin film transistor including an upper gate electrode, the first connection portion 130a and the second connection portion 130b may be formed by implanting dopants by performing an ion implantation process using the gate electrode 150 or photoresist spaced apart from the active layer 130 as a mask pattern. When the ion implantation process of the dopant is performed on the first connection portion 130a and the second connection portion 130b of the active layer 130, the first connection portion 130a and the second connection portion 130b of the conductor portions by the selective conduction may be formed except for the channel portion 130n masked by the gate electrode 150. According to one aspect of the present disclosure, dopant for the conduction of the first connection portion 130a and the second connection portion 130b may include at least one of boron B, phosphorus P, fluorine F, and hydrogen H.

According to the aspect of the present disclosure, the first connection portion 130a of the active layer 130 of the first thin film transistor TR1 may be a source region, and the second connection portion 130b may be a drain region. However, the aspect of the present disclosure is not limited thereto, and the first connection portion 130a may be a drain region and the second connection portion 130b may be a source region.

According to one aspect of the present disclosure, the active layer 130 of the first thin film transistor TR1 and the active layer 230 of the second thin film transistor TR2 may include an oxide semiconductor material.

The active layer 130 of the first thin film transistor TR1 may include a first oxide semiconductor layer 131.

The first oxide semiconductor layer 131 may serve as a main active layer.

The first oxide semiconductor layer 131 may include, for example, at least one of IGZO(InGaZnO)-based oxide semiconductor material, IZO(InZnO)-based oxide semiconductor material, IGZTO(InGaZnSnO)-based oxide semiconductor material, ITZO(InSnZnO)-based oxide semiconductor material, FIZO(FeInZnO)-based oxide semiconductor material, ZnO-based oxide semiconductor material, SIZO(SiInZnO)-based oxide semiconductor material, and ZnON(ZnOxynitride)-based oxide semiconductor material.

According to one aspect of the present disclosure, a first oxide semiconductor layer 231 of the second thin film transistor TR2 may have a good mobility. A mobility of the first oxide semiconductor layer 231 of the second thin film transistor TR2 is greater than a mobility of a second oxide semiconductor layer 232 of the second thin film transistor TR2. The first oxide semiconductor layer 231 of the second thin film transistor TR2 serves as a main active layer, and the second oxide semiconductor layer 232 of the second thin film transistor TR2 serves as an interface layer.

The first oxide semiconductor layer 231 of the second thin film transistor TR2 may include, for example, at least one of IGZO(InGaZnO)-based oxide semiconductor material, IZO (InZnO)-based oxide semiconductor material, IGZTO(InGaZnSnO)-based oxide semiconductor material, ITZO(InSnZnO)-based oxide semiconductor material, FIZO (FeInZnO)-based oxide semiconductor material, ZnO-based oxide semiconductor material, SIZO(SiInZnO)-based oxide semiconductor material, and ZnON(Zn-Oxynitride)-based oxide semiconductor material.

According to one aspect of the present disclosure, the first oxide semiconductor layer 231 may support the second oxide semiconductor layer 232. Thus, the first oxide semiconductor layer 231 may be referred to as a support layer.

The second oxide semiconductor layer 232 may be made of an oxide semiconductor material having a good stability. For example, the second oxide semiconductor layer 232 may include at least one of IGZO(InGaZnO)-based oxide semiconductor material [Ga concentration>In concentration], GZO(GaZnO)-based oxide semiconductor material, IGO (InGaO)-based oxide semiconductor material, and GZTO (GaZnSnO)-based oxide semiconductor material.

The gate electrode 150 of the first thin film transistor TR1 may be disposed on the gate insulating film 140. The gate electrode 150 overlaps with the channel portion 130n of the active layer 130.

A gate electrode 250 of the second thin film transistor TR2 may be disposed on the gate insulating film 140. The gate electrode 250 overlaps with a channel portion 230n of the active layer 230.

According to the aspect of the present disclosure, the gate electrode 150 and 250 may include at least one of aluminum-based metal materials such as aluminum (Al), aluminum alloys, silver-based metal materials such as silver (Ag) or silver alloys, copper-based metal materials such as copper (Cu), copper alloys, molybdenum-based metal materials such as molybdenum (Mo), molybdenum alloys, chromium (Cr), tantalum (Ta), neodymium (Nd), and titanium (Ti). The gate electrode 150 may have a multi-layered structure including at least two conductive films having the different physical properties.

An interlayer insulating film 160 may be commonly disposed on the gate electrodes 150 and 250 and the gate insulating film 140.

The interlayer insulating film 160 may include a silicon oxide (SiOx) film or a silicon nitride (SiNx) layer and may protect the thin film transistor. A portion of the interlayer insulating film 160 corresponding to a contact hole may be removed to contact the active layer 130 and 230 to a first electrode 171 and 271 and a second electrode 172 and 272.

The first electrode 171 and the second electrode 172 of the first thin film transistor TR1 may be disposed on the interlayer insulating film 160.

The first electrode 171 and the second electrode 172 of the first thin film transistor TR1 may overlap with the first connection portion 130a and the second connection portion 130b. The first electrode 171 may serve as a source electrode, and the second electrode 172 may serve as a drain electrode. However, the aspects of the present disclosure are not limited thereto, and the first electrode 171 may serve as a drain electrode, and the second electrode 172 may serve as a source electrode. In addition, the first connection portion 130a and the second connection portion 130b serve as a source electrode and a drain electrode, respectively, and the first electrode 171 and the second electrode 172 may serve as a connection electrode between the devices.

The first electrode 171 and the second electrode 172 of the first thin film transistor TR1 may be connected to the active layer 130 through first and second contact holes CH1 and CH2, respectively. Specifically, the first electrode 171 may be in contact with the first connection portion 130a through the first contact hole CH1, and the second electrode 172 may be spaced apart from the first electrode 171 and may be in contact with the second connection portion 130b through the second contact hole CH2.

The first electrode 271 and the second electrode 272 of the second thin film transistor TR2 may overlap with the first connection portion 230a and the second connection portion 230b. The first electrode 271 may serve as a source electrode, and the second electrode 272 may serve as a drain electrode. However, the aspects of the present disclosure are not limited thereto, and the first electrode 271 may serve as a drain electrode, and the second electrode 272 may serve as a source electrode. In addition, the first connection portion 230a and the second connection portion 230b serve as a source electrode and a drain electrode, respectively, and the first electrode 271 and the second electrode 272 may serve as a connection electrode between the devices.

The first electrode 271 and the second electrode 272 of the second thin film transistor TR2 may be connected to the active layer 230 through first and second contact holes CH1 and CH2, respectively. Specifically, the first electrode 271 may be in contact with the first connection portion 230a through the first contact hole CH1, and the second electrode 272 may be spaced apart from the first electrode 271 and may be in contact with the second connection portion 230b through the second contact hole CH2.

A thickness of the active layer 130 of the first thin film transistor TR1 of the thin film transistor array 100 according to the present disclosure may be smaller than a thickness of the active layer 230 of the second thin film transistor TR2 of the thin film transistor array 100 according to the present disclosure.

Also, the active layer 130 of the first thin film transistor TR1 of the thin film transistor array 100 according to the present disclosure may include copper. More particularly, the first oxide semiconductor layer 131 may include copper. Here, copper may be referred to as carrier acceptor.

According to the aspect of the present disclosure, the copper Cu may be in an ion state. For example, in the active layer 130, copper Cu may be in a state of $Cu_2O$ or $CuO$. When copper Cu is in a state of $Cu_2O$, copper Cu may be referred to as a monovalent ion $Cu^+$ state. When copper Cu is in a state of $CuO$, copper Cu may be referred to as a divalent ion $Cu^{2+}$ state. Here, $CuO$ or $Cu^+$ may be referred to as a first carrier acceptor, and $Cu_2O$ or $Cu^{2+}$ may be referred to as a second carrier acceptor.

According to one aspect of the present disclosure, "copper Cu" means that it includes both copper atoms and copper ions $Cu^+$ and $Cu^{2+}$.

According to one aspect of the present disclosure, copper Cu contained in the first oxide semiconductor layer 131 of the first thin film transistor TR1 may be mainly in a divalent ion $Cu^{2+}$ state. Specifically, copper Cu of the first oxide semiconductor layer 131 includes $Cu^+$ and $Cu^{2+}$. According to one aspect of the present disclosure, the concentration of $Cu^{2+}$ in the first oxide semiconductor layer 131 may be higher than the concentration of $Cu^+$ in the first oxide semiconductor layer 131.

The copper Cu combined with oxygen may exhibit an effect such as formation of an artificial defect in the first oxide semiconductor layer 131 of the first thin film transistor TR1. The copper Cu inducing this defect forms an acceptor like trap or an interface trap $D_{it}$ so that it is possible to increase an S-factor of the first thin film transistor TR1 of the thin film transistor array 100 according to the present disclosure, and to shift a threshold voltage to a positive direction (+). Generally, "$D_{it}$" is used as a term that represents a density of the interface trap. However, in the present disclosure, "$D_{it}$" is used as a term that indicates a location where an interface trap effect is implemented by a defect of copper Cu. For example, the first thin film transistor TR1 of the thin film transistor array 100 may be a driving thin film transistor, but not limited thereto.

A thickness of the active layer 230 of the second thin film transistor TR2 of the thin film transistor array 100 according to the present disclosure may be larger than a thickness of the active layer 130 of the first thin film transistor TR1 of the thin film transistor array 100 according to the present disclosure.

Also, the active layer 230 of the second thin film transistor TR2 of the thin film transistor array 100 according to the present disclosure may include copper. More particularly, the second oxide semiconductor layer 232 may include copper. The first oxide semiconductor layer 231 of the second thin film transistor TR2 may not include copper.

According to the aspect of the present disclosure, the copper Cu may be in an ion state. For example, in the active layer 230, copper Cu may be in a state of $Cu_2O$ or CuO. When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the second oxide semiconductor layer 232 of the second thin film transistor TR2 may be mainly in a divalent ion $Cu^{2+}$ state. Specifically, copper Cu of the second oxide semiconductor layer 232 includes $Cu^+$ and $Cu^{2+}$. According to one aspect of the present disclosure, the concentration of $Cu^{2+}$ in the second oxide semiconductor layer 232 may be higher than the concentration of $Cu^+$ in the second oxide semiconductor layer 232.

The copper Cu combined with oxygen may exhibit an effect such as formation of an artificial defect in the second oxide semiconductor layer 232 of the second thin film transistor TR2. The copper Cu inducing this defect forms an acceptor like trap or an interface trap $D_{it}$. The second oxide semiconductor layer 232 does not function as a main channel of the active layer 230, whereby it is possible to maintain a low S-factor in the second thin film transistor TR2 of the thin film transistor array, and to raise driving current and mobility. The copper Cu of the second oxide semiconductor layer 232 according to the present disclosure may not correspond to the electrical behavior of the thin film transistor. For example, the second thin film transistor TR2 of the thin film transistor array 100 may be a switching thin film transistor or a gate-in-panel GIP circuit, but not limited thereto.

Also, according to one aspect of the present disclosure, a copper concentration inside the first oxide semiconductor layer 131 of the first thin film transistor TR1 may be higher than a copper concentration inside the first oxide semiconductor layer 231 of the second thin film transistor TR2.

The second oxide semiconductor layer 232 of the second thin film transistor TR2 may have a first thickness t1. For example, the first thickness t1 may be more than 3 nm.

If the first thickness t1 of the second oxide semiconductor layer 232 of the second thin film transistor TR2 is less than 3 nm, the copper (Cu) may be diffused to the first oxide semiconductor layer 231 beyond the second oxide semiconductor layer 232, whereby the S-factor may be raised, and the threshold voltage may be shifted to a positive direction (+). Thus, it may be difficult to secure the desired electrical characteristics in the second thin film transistor TR2. The copper may be included in the first oxide semiconductor layer 231. In this case, a copper concentration inside the first oxide semiconductor layer 231 may be lower than a copper concentration inside the second oxide semiconductor layer 232.

Figure 2:
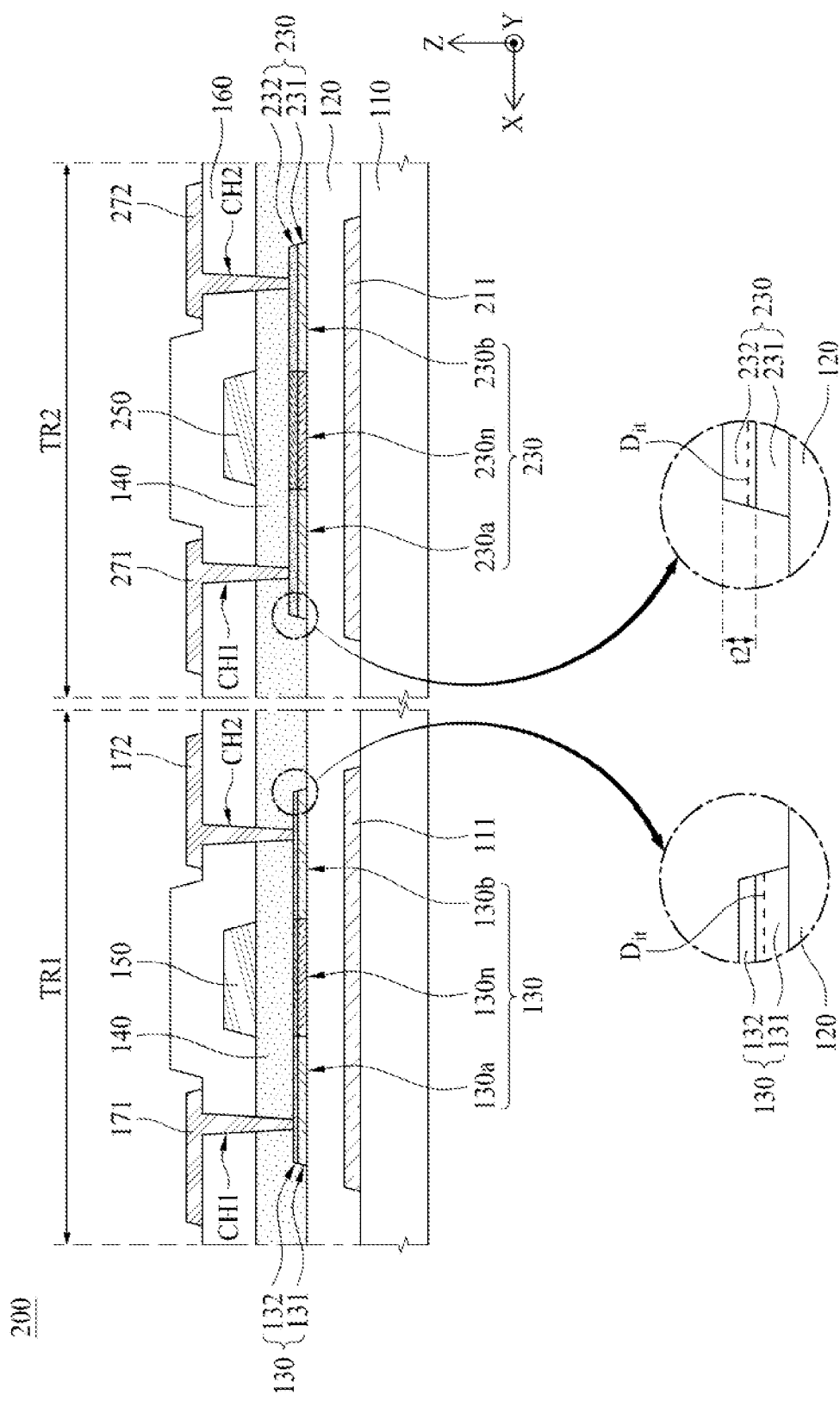
FIGS. 2 to 6 cross sectional views of thin film transistor arrays according to various aspects of the present disclosure.

FIG. 2 is a cross sectional view of a thin film transistor array according to another aspect of the present disclosure.

Except an active layer 130 of a first thin film transistor TR1 and an active layer 230 of a second thin film transistor TR2, the thin film transistor array 200 according to another aspect of the present disclosure shown in FIG. 2 is identical in structure to the thin film transistor array 100 shown in FIG. 1, whereby the same reference numerals are assigned to the same parts, and a duplicate description thereof will be omitted.

Referring to FIG. 2, the active layer 130 of the first thin film transistor TR1 of the thin film transistor array 200 according to another aspect of the present disclosure is formed of double oxide semiconductor layers 131 and 132, and the active layer 230 of the second thin film transistor TR2 may be formed of double oxide semiconductor layers 231 and 232.

A thickness of the active layer 130 of the first thin film transistor TR1 of the thin film transistor array 200 according to another aspect of the present disclosure may be smaller than a thickness of the active layer 230 of the second thin film transistor TR2.

The active layer 130 of the first thin film transistor TR1 may include a first oxide semiconductor layer 131, and a second oxide semiconductor layer 132 on the first oxide semiconductor layer 131.

According to one aspect of the present disclosure, the first oxide semiconductor layer 131 may have good mobility characteristics. A mobility of the first oxide semiconductor layer 131 may be greater than a mobility of the second oxide semiconductor layer 132. The first oxide semiconductor layer 131 serves as a main active layer, and the second oxide semiconductor layer 132 serves as an interface layer.

The first oxide semiconductor layer 131 may include, for example, at least one of IGZO(InGaZnO)-based oxide semiconductor material, IZO(InZnO)-based oxide semiconductor material, IGZTO(InGaZnSnO)-based oxide semiconductor material, ITZO(InSnZnO)-based oxide semiconductor material, FIZO(FeInZnO)-based oxide semiconductor material, ZnO-based oxide semiconductor material, SIZO(SiInZnO)-based oxide semiconductor material, and ZnON(Zn-Oxynitride)-based oxide semiconductor material.

According to one aspect of the present disclosure, the first oxide semiconductor layer 131 may support the second oxide semiconductor layer 132. Thus, the first oxide semiconductor layer 131 may be referred to as a support layer.

The second oxide semiconductor layer 132 may be made of an oxide semiconductor material having a good stability.

For example, the second oxide semiconductor layer 132 may include at least one of IGZO(InGaZnO)-based oxide semiconductor material [Ga concentration>In concentration], GZO(GaZnO)-based oxide semiconductor material, IGO (InGaO)-based oxide semiconductor material, and GZTO (GaZnSnO)-based oxide semiconductor material.

The first oxide semiconductor layer 231 of the second thin film transistor TR2 may include, for example, at least one of IGZO(InGaZnO)-based oxide semiconductor material, IZO (InZnO)-based oxide semiconductor material, IGZTO(InGaZnSnO)-based oxide semiconductor material, ITZO(InSnZnO)-based oxide semiconductor material, FIZO (FeInZnO)-based oxide semiconductor material, ZnO-based oxide semiconductor material, SIZO(SiInZnO)-based oxide semiconductor material, and ZnON(Zn-Oxynitride)-based oxide semiconductor material.

According to one aspect of the present disclosure, the first oxide semiconductor layer 231 may support the second oxide semiconductor layer 232. Thus, the first oxide semiconductor layer 231 may be referred to as a support layer. The first oxide semiconductor layer 231 serves as a main active layer, and the second oxide semiconductor layer 232 serves as an interface layer.

The second oxide semiconductor layer 232 may be made of an oxide semiconductor material having a good stability. For example, the second oxide semiconductor layer 232 may include at least one of IGZO(InGaZnO)-based oxide semiconductor material [Ga concentration>In concentration], GZO(GaZnO)-based oxide semiconductor material, IGO (InGaO)-based oxide semiconductor material, and GZTO (GaZnSnO)-based oxide semiconductor material.

Also, the active layer 130 of the first thin film transistor TR1 of the thin film transistor array 200 according to the present disclosure may include copper. More particularly, the first oxide semiconductor layer 131 may include copper.

According to the aspect of the present disclosure, the copper Cu may be in an ion state. For example, in the active layer 130, copper Cu may be in a state of $Cu_2O$ or CuO. When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the first oxide semiconductor layer 131 may be mainly in a divalent ion $Cu^{2+}$ state. Specifically, copper Cu of the first oxide semiconductor layer 131 includes $Cu^+$ and $Cu^{2+}$. According to one aspect of the present disclosure, the concentration of $Cu^{2+}$ in the first oxide semiconductor layer 131 may be higher than the concentration of $Cu^+$ in the first oxide semiconductor layer 131.

The copper Cu combined with oxygen may exhibit an effect such as formation of an artificial defect in the first oxide semiconductor layer 131. The copper Cu inducing this defect forms an acceptor like trap or an interface trap $D_{it}$ so that it is possible to increase an S-factor of the first thin film transistor TR1 of the thin film transistor array 200 according to the present disclosure, and to shift a threshold voltage to a positive direction (+). For example, the first thin film transistor TR1 of the thin film transistor array 200 may be a driving thin film transistor, but not limited thereto.

A copper concentration of the first oxide semiconductor layer 131 of the first thin film transistor TR1 may be higher than a copper concentration of the second oxide semiconductor layer 132.

A thickness of the active layer 230 of the second thin film transistor TR2 of the thin film transistor array 200 according to the present disclosure may be larger than a thickness of the active layer 130 of the first thin film transistor TR1.

Also, the active layer 230 of the second thin film transistor TR2 of the thin film transistor array 200 according to the present disclosure may include copper. More particularly, the second oxide semiconductor layer 232 may include copper. The first oxide semiconductor layer 231 of the second thin film transistor TR2 may not include copper.

According to the aspect of the present disclosure, the copper Cu may be in an ion state. For example, in the active layer 130, copper Cu may be in a state of $Cu_2O$ or CuO. When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the second oxide semiconductor layer 232 of the second thin film transistor TR2 may be mainly in a divalent ion $Cu^{2+}$ state. Specifically, copper Cu of the second oxide semiconductor layer 232 includes $Cu^+$ and $Cu^{2+}$. According to one aspect of the present disclosure, the concentration of $Cu^{2+}$ in the second oxide semiconductor layer 232 may be higher than the concentration of $Cu^+$ in the second oxide semiconductor layer 232.

The copper Cu combined with oxygen may exhibit an effect such as formation of an artificial defect in the second oxide semiconductor layer 232 of the second thin film transistor TR2. The copper Cu inducing this defect forms an acceptor like trap or an interface trap $D_{it}$. It is possible to maintain a low S-factor in the second thin film transistor TR2 of the thin film transistor array 200, and to raise driving current and mobility. Also, the second oxide semiconductor layer 232 does not serve as a main channel of the active layer 230, whereby the copper Cu of the second oxide semiconductor layer 232 may not correspond to the electrical behavior of the thin film transistor. For example, the second thin film transistor TR2 of the thin film transistor array 200 may be a switching thin film transistor or a gate-in-panel GIP circuit, but not limited thereto.

The second oxide semiconductor layer 232 of the second thin film transistor TR2 may have a second thickness t2. For example, the second thickness t2 may be more than 3 nm.

If the second thickness t2 of the second oxide semiconductor layer 232 of the second thin film transistor TR2 is less than 3 nm, the copper Cu may be diffused to the first oxide semiconductor layer 231 beyond the second oxide semiconductor layer 232, whereby the S-factor may be raised, and the threshold voltage may be shifted to a positive direction (+). Thus, it may be difficult to secure the desired electrical characteristics in the second thin film transistor TR2. The copper may be included in the first oxide semiconductor layer 231. In this case, a copper concentration inside the first oxide semiconductor layer 231 may be lower than a copper concentration inside the second oxide semiconductor layer 232.

Figure 3:
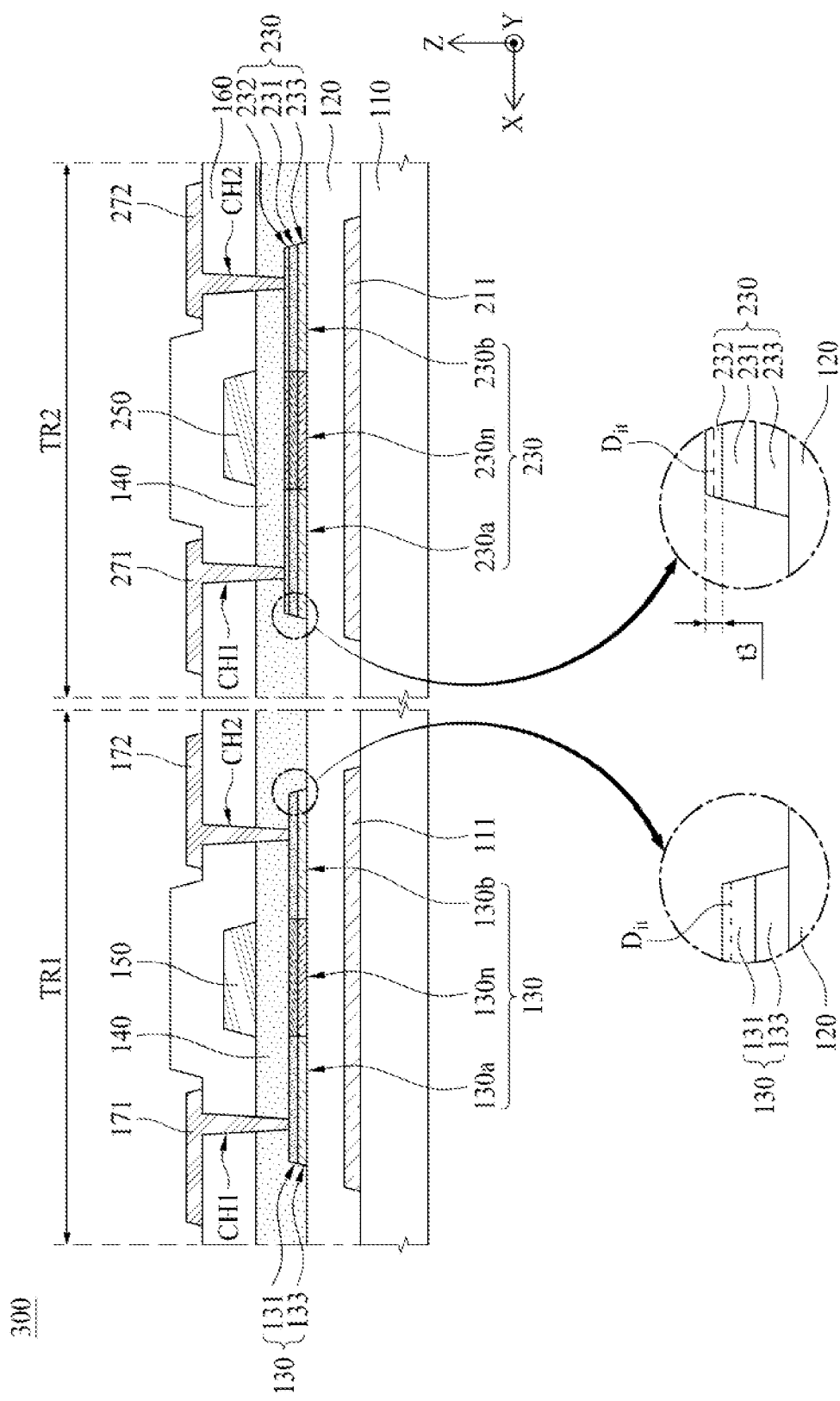

FIG. 3 is a cross sectional view of a thin film transistor array according to another aspect of the present disclosure.

Except an active layer 130 of a first thin film transistor TR1 and an active layer 230 of a second thin film transistor TR2, the thin film transistor array 300 according to another aspect of the present disclosure shown in FIG. 3 is identical in structure to the thin film transistor array 100 shown in FIG. 1, whereby the same reference numerals are assigned to the same parts, and a duplicate description thereof will be omitted.

Referring to FIG. 3, the first thin film transistor TR1 of the thin film transistor array 300 according to another aspect of the present disclosure is formed of double oxide semiconductor layers 131 and 133, and the active layer 230 of the second thin film transistor TR2 may be formed of triple oxide semiconductor layers 231, 232, and 233.

A thickness of the active layer 130 of the first thin film transistor TR1 of the thin film transistor array 300 according to another aspect of the present disclosure may be smaller than a thickness of the active layer 230 of the second thin film transistor TR2.

The active layer 130 of the first thin film transistor TR1 may include a first oxide semiconductor layer 131, and a third oxide semiconductor layer 133 under the first oxide semiconductor layer 131.

According to one aspect of the present disclosure, the first oxide semiconductor layer 131 may have good mobility characteristics. A mobility of the first oxide semiconductor layer 131 may be greater than a mobility of the third oxide semiconductor layer 133. The first oxide semiconductor layer 131 serves as a main active layer, and also serves as an interface layer.

The first oxide semiconductor layer 131 may include, for example, at least one of IGZO(InGaZnO)-based oxide semiconductor material, IZO(InZnO)-based oxide semiconductor material, IGZTO(InGaZnSnO)-based oxide semiconductor material, ITZO(InSnZnO)-based oxide semiconductor material, FIZO(FeInZnO)-based oxide semiconductor material, ZnO-based oxide semiconductor material, SIZO(SiInZnO)-based oxide semiconductor material and ZnON(Zn-Oxynitride)-based oxide semiconductor material.

According to one aspect of the present disclosure, the third oxide semiconductor layer 133 may support the first oxide semiconductor layer 131. Thus, the third oxide semiconductor layer 133 may be referred to as a support layer.

The third oxide semiconductor layer 133 may be made of an oxide semiconductor material having a good stability. For example, the third oxide semiconductor layer 133 may include at least one of IGZO(InGaZnO)-based oxide semiconductor material [Ga concentration>In concentration], GZO(GaZnO)-based oxide semiconductor material, IGO (InGaO)-based oxide semiconductor material, and GZTO (GaZnSnO)-based oxide semiconductor material.

The active layer 230 of the second thin film transistor TR2 may include a first oxide semiconductor layer 231, a second oxide semiconductor layer 232 on the first oxide semiconductor layer 231, and a third oxide semiconductor layer 233 under the first oxide semiconductor layer 231.

According to one aspect of the present disclosure, the first oxide semiconductor layer 231 of the second thin film transistor TR2 may have good mobility characteristics. A mobility of the first oxide semiconductor layer 231 may be greater than a mobility of each of the second oxide semiconductor layer 232 and the third oxide semiconductor layer 233. The first oxide semiconductor layer 231 serves as a main active layer, and the second oxide semiconductor layer 232 serves as an interface layer.

The first oxide semiconductor layer 231 of the second thin film transistor TR2 may include, for example, at least one of IGZO(InGaZnO)-based oxide semiconductor material, IZO (InZnO)-based oxide semiconductor material, IGZTO(InGaZnSnO)-based oxide semiconductor material, ITZO(InSnZnO)-based oxide semiconductor material, FIZO (FeInZnO)-based oxide semiconductor material, ZnO-based oxide semiconductor material, SIZO(SiInZnO)-based oxide semiconductor material, and ZnON(Zn-Oxynitride)-based oxide semiconductor material.

According to one aspect of the present disclosure, the third oxide semiconductor layer 233 may support the first oxide semiconductor layer 231 and the second oxide semiconductor layer 232. Thus, the third oxide semiconductor layer 233 may be referred to as a support layer.

The second oxide semiconductor layer 232 and the third oxide semiconductor layer 233 may be made of an oxide semiconductor material having a good stability. For example, the second oxide semiconductor layer 232 and the third oxide semiconductor layer 233 may include at least one of IGZO(InGaZnO)-based oxide semiconductor material [Ga concentration>In concentration], GZO(GaZnO)-based oxide semiconductor material, IGO(InGaO)-based oxide semiconductor material, and GZTO(GaZnSnO)-based oxide semiconductor material.

According to the aspect of the present disclosure, the first oxide semiconductor layer 131 of the first thin film transistor TR1 of the thin film transistor array 300 may include copper.

According to the aspect of the present disclosure, the copper Cu may be in an ion state. For example, in the first oxide semiconductor layer 131 of the first thin film transistor TR1, copper Cu may be in a state of $Cu_2O$ or $CuO$. When copper Cu is in a state of $Cu_2O$, copper Cu may be referred to as a monovalent ion $Cu^+$ state. When copper Cu is in a state of $CuO$, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the first oxide semiconductor layer 131 of the first thin film transistor TR1 may be mainly in a divalent ion $Cu^{2+}$ state. Specifically, copper Cu of the first oxide semiconductor layer 131 of the first thin film transistor TR1 includes $Cu^+$ and $Cu^{2+}$. According to one aspect of the present disclosure, the concentration of $Cu^{2+}$ in the first oxide semiconductor layer 131 may be higher than the concentration of $Cu^+$ in the first oxide semiconductor layer 131.

The copper Cu combined with oxygen may exhibit an effect such as formation of an artificial defect in the first oxide semiconductor layer 131 of the first thin film transistor TR1. The copper Cu inducing this defect forms an acceptor like trap or an interface trap $D_{it}$ so that it is possible to increase an S-factor of the first thin film transistor TR1 of the thin film transistor array 300 according to the present disclosure, and to shift a threshold voltage to a positive direction (+). For example, the first thin film transistor TR1 of the thin film transistor array 300 may be a driving thin film transistor, but not limited thereto.

A thickness of the active layer 230 of the second thin film transistor TR2 of the thin film transistor array 300 according to the present disclosure may be larger than a thickness of the active layer 130 of the first thin film transistor TR1.

Also, the active layer 230 of the second thin film transistor TR2 of the thin film transistor array 300 according to the present disclosure may include copper. More particularly, the second oxide semiconductor layer 232 may include copper. The first oxide semiconductor layer 231 and the third oxide semiconductor layer 233 of the second thin film transistor TR2 may not include copper.

According to the aspect of the present disclosure, the copper Cu may be in an ion state. For example, in the active layer 130, copper Cu may be in a state of $Cu_2O$ or $CuO$.

When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the second oxide semiconductor layer 232 of the second thin film transistor TR2 may be mainly in a divalent ion $Cu^{2+}$ state. Specifically, copper Cu of the second oxide semiconductor layer 232 of the second thin film transistor TR2 includes $Cu^+$ and $Cu^{2+}$. According to one aspect of the present disclosure, the concentration of $Cu^{2+}$ in the second oxide semiconductor layer 232 may be higher than the concentration of $Cu^+$ in the second oxide semiconductor layer 232.

The copper Cu combined with oxygen may exhibit an effect such as formation of an artificial defect in the second oxide semiconductor layer 232 of the second thin film transistor TR2. The copper Cu inducing this defect forms an acceptor like trap or an interface trap $D_{it}$. Thus, it is possible to maintain a low S-factor in the second thin film transistor TR2 of the thin film transistor array 300, and to raise driving current and mobility. Also, the second oxide semiconductor layer 232 of the second thin film transistor TR2 does not function as a main active layer of the active layer 230, whereby it may be different from the effect of acceptor like trap or interface trap by the copper Cu of the first oxide semiconductor layer 131 of the first thin film transistor TR1. For example, the second thin film transistor TR2 of the thin film transistor array 300 may be a switching thin film transistor or a gate-in-panel GIP circuit, but not limited thereto.

The second oxide semiconductor layer 232 of the second thin film transistor TR2 may have a third thickness t3. For example, the third thickness t3 may be more than 3 nm.

If the third thickness t3 of the second oxide semiconductor layer 232 of the second thin film transistor TR2 is less than 3 nm, the copper Cu may be diffused to the first oxide semiconductor layer 231 functioning as a main active layer beyond the second oxide semiconductor layer 232, whereby the S-factor may be raised, and the threshold voltage may be shifted to a positive direction (+). Thus, it may be difficult to secure the desired electrical characteristics in the second thin film transistor TR2.

Figure 4:
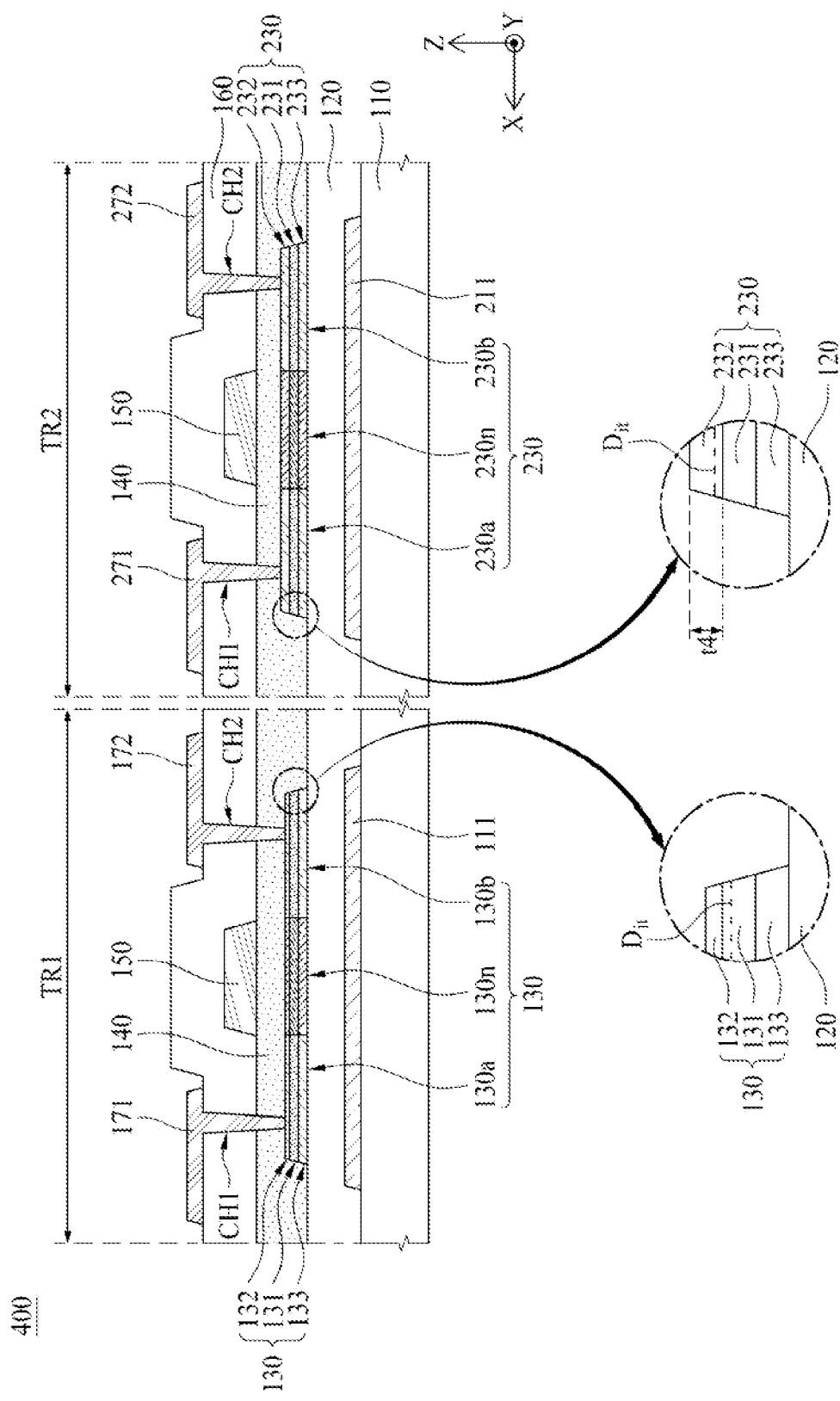

FIG. 4 is a cross sectional view of a thin film transistor array according to another aspect of the present disclosure.

Except an active layer 130 of a first thin film transistor TR1 and an active layer 230 of a second thin film transistor TR2, the thin film transistor array 400 according to another aspect of the present disclosure shown in FIG. 4 is identical in structure to the thin film transistor array 100 shown in FIG. 1, whereby the same reference numerals are assigned to the same parts, and a duplicate description thereof will be omitted.

Referring to FIG. 4, in the first thin film transistor TR1, the active layer 130 having a channel portion 130n, a first connection portion 130a, and a second connection portion 130b includes first to third oxide semiconductor layers 131, 132, and 133.

In the second thin film transistor TR2, the active layer 230 having a channel portion 230n, a first connection portion 230a, and a second connection portion 230b includes first to third oxide semiconductor layers 231, 232, and 233.

According to one aspect of the present disclosure, the first oxide semiconductor layer 131 of the first thin film transistor TR1 may be a main active layer. For example, the first oxide semiconductor layer 131 may include a material whose mobility is greater than a mobility of each of the second oxide semiconductor layer 132 and the third oxide semiconductor layer 133.

The active layer 130 of the first thin film transistor TR1 may include the first oxide semiconductor layer 131, the second oxide semiconductor layer 132 on the first oxide semiconductor layer 131, and the third oxide semiconductor layer 133 under the first oxide semiconductor layer 131.

According to one aspect of the present disclosure, the first oxide semiconductor layer 131 may have good mobility characteristics. A mobility of the first oxide semiconductor layer 131 may be greater than a mobility of each of the second oxide semiconductor layer 132 and the third oxide semiconductor layer 133. The first oxide semiconductor layer 131 serves as a main active layer, and the second oxide semiconductor layer 132 serves as an interface layer.

The first oxide semiconductor layer 131 may include, for example, at least one of IGZO(InGaZnO)-based oxide semiconductor material, IZO(InZnO)-based oxide semiconductor material, IGZTO(InGaZnSnO)-based oxide semiconductor material, ITZO(InSnZnO)-based oxide semiconductor material, FIZO(FeInZnO)-based oxide semiconductor material, ZnO-based oxide semiconductor material, SIZO(SiInZnO)-based oxide semiconductor material, and ZnON(Zn-Oxynitride)-based oxide semiconductor material.

According to one aspect of the present disclosure, the third oxide semiconductor layer 133 may support the first oxide semiconductor layer 131 and the second oxide semiconductor layer 132. Thus, the third oxide semiconductor layer 133 may be referred to as a support layer.

The second oxide semiconductor layer 132 and the third oxide semiconductor layer 133 may be made of an oxide semiconductor material having a good stability. For example, the second oxide semiconductor layer 132 and the third oxide semiconductor layer 133 may include at least one of IGZO(InGaZnO)-based oxide semiconductor material [Ga concentration>In concentration], GZO(GaZnO)-based oxide semiconductor material, IGO(InGaO)-based oxide semiconductor material, and GZTO(GaZnSnO)-based oxide semiconductor material.

The active layer 230 of the second thin film transistor TR2 may include the first oxide semiconductor layer 231, the second oxide semiconductor layer 232 on the first oxide semiconductor layer 231, and the third oxide semiconductor layer 233 under the first oxide semiconductor layer 231.

According to one aspect of the present disclosure, the first oxide semiconductor layer 231 of the second thin film transistor TR2 serves as a main active layer, and the second oxide semiconductor layer 232 serves as an interface layer. The first oxide semiconductor layer 231 of the second thin film transistor TR2 may include a material whose mobility is greater than a mobility of the second oxide semiconductor layer 232 and the third oxide semiconductor layer 233.

According to the aspect of the present disclosure, the first oxide semiconductor layer 131 of the first thin film transistor TR1 of the thin film transistor array 400 according to the present disclosure may include copper.

According to the present disclosure, the copper Cu may be in an ion state. For example, in the first oxide semiconductor layer 131 of the first thin film transistor TR1, copper Cu may be in a state of $Cu_2O$ or CuO. When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the first oxide semiconductor layer 131 of the first thin film transistor TR1 may be mainly in a divalent ion $Cu^{2+}$ state. Specifically, copper Cu of the first oxide semiconductor layer 131 of the first thin film transistor TR1 includes $Cu^+$ and $Cu^{2+}$. According to one aspect of the present disclosure, the concentration of $Cu^{2+}$ in the first oxide semiconductor layer 131 may be higher than the concentration of $Cu^+$ in the first oxide semiconductor layer 131.

The copper Cu combined with oxygen may exhibit an effect such as formation of an artificial defect in the first oxide semiconductor layer 131 of the first thin film transistor TR1. The copper Cu inducing this defect forms an acceptor like trap or an interface trap $D_{it}$ so that it is possible to increase an S-factor of the first thin film transistor TR1 of the thin film transistor array 400 according to the present disclosure, and to shift a threshold voltage to a positive direction (+). For example, the first thin film transistor TR1 of the thin film transistor array 400 may be a driving thin film transistor, but not limited thereto.

A thickness of the active layer 230 of the second thin film transistor TR2 of the thin film transistor array 400 according to the present disclosure may be larger than a thickness of the active layer 130 of the first thin film transistor TR1 of the thin film transistor array 400 according to the present disclosure.

Also, the active layer 230 of the second thin film transistor TR2 of the thin film transistor array 400 according to the present disclosure may include copper. More particularly, the second oxide semiconductor layer 232 may include copper.

According to the aspect of the present disclosure, the copper Cu may be in an ion state. For example, in the active layer 130, copper Cu may be in a state of $Cu_2O$ or CuO. When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

According to one aspect of the present disclosure, copper Cu contained in the second oxide semiconductor layer 232 of the second thin film transistor TR2 may be mainly in a divalent ion $Cu^{2+}$ state. Specifically, copper Cu of the second oxide semiconductor layer 232 of the second thin film transistor TR2 includes $Cu^+$ and $Cu^{2+}$. According to one aspect of the present disclosure, the concentration of $Cu^{2+}$ in the second oxide semiconductor layer 232 of the second thin film transistor TR2 may be higher than the concentration of $Cu^+$ in the second oxide semiconductor layer 232 of the second thin film transistor TR2.

The copper Cu combined with oxygen may exhibit an effect such as formation of an artificial defect in the second oxide semiconductor layer 232 of the second thin film transistor TR2. The copper Cu inducing this defect forms an acceptor like trap or an interface trap $D_{it}$. Thus, it is possible to maintain a low S-factor in the second thin film transistor TR2 of the thin film transistor array 400, and to raise driving current and mobility. The second oxide semiconductor layer 232 of the second thin film transistor TR2 does not serve as a main active layer of the active layer 230, whereby it may be different from the effect of acceptor like trap or interface trap by the copper Cu of the first oxide semiconductor layer 131 of the first thin film transistor TR1. For example, the second thin film transistor TR2 of the thin film transistor array 400 may be a switching thin film transistor or a gate-in-panel GIP circuit, but not limited thereto.

The second oxide semiconductor layer 232 of the second thin film transistor TR2 may have a fourth thickness t4. For example, the fourth thickness t4 may be more than 3 nm.

If the fourth thickness t4 of the second oxide semiconductor layer 232 of the second thin film transistor TR2 is less than 3 nm, the copper Cu may be diffused to the first oxide semiconductor layer 231 functioning as a main active layer beyond the second oxide semiconductor layer 232, whereby the S-factor may be raised, and the threshold voltage may be shifted to a positive direction (+). Thus, it may be difficult to secure the desired electrical characteristics in the second thin film transistor TR2.

Figure 5:
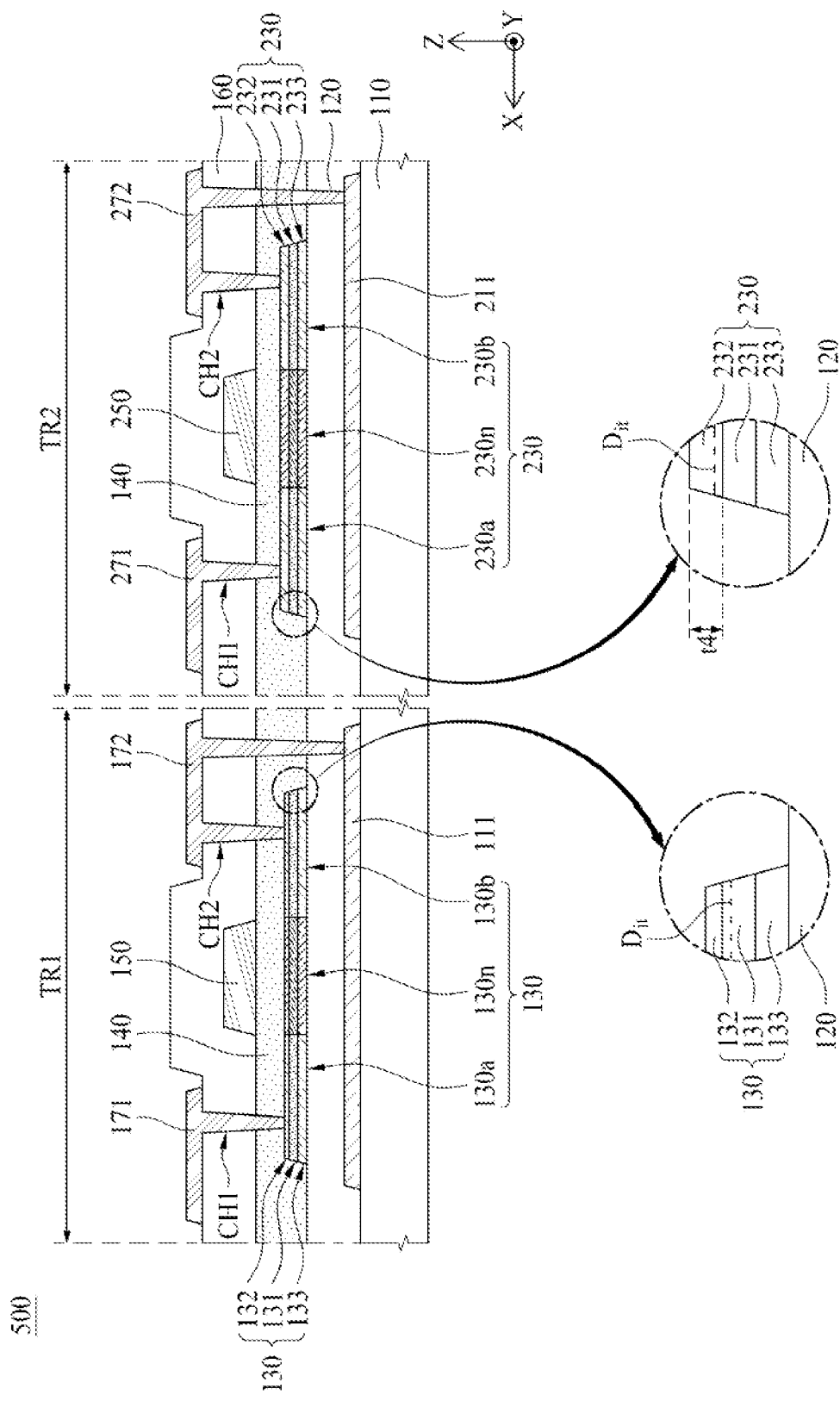

FIG. 5 is a cross sectional view of a thin film transistor array according to another aspect of the present disclosure.

Except a structure of connecting a second connection portion 130b of an active layer 130 of a first thin film transistor TR1 to a light shielding layer 111 through a second electrode 172, and a structure of connecting a second connection portion 230b of an active layer 230 of a second thin film transistor TR2 to a light shielding layer 211 through a second electrode 272, the thin film transistor array 500 shown in FIG. 5 is identical in structure to the thin film transistor array 400 shown in FIG. 4, whereby the same reference numerals are assigned to the same parts, and a duplicate description thereof will be omitted.

Referring to FIG. 5, the active layer 130 of the first thin film transistor TR1 is connected to the light shielding layer 111, and the active layer 230 of the second thin film transistor TR2 is connected to the light shielding layer 211 so that it is possible to prevent a shift phenomenon of a threshold voltage and to improve a current supply stability. Also, the structure of connecting the second connection portion 130b of the active layer 130 of the first thin film transistor TR1 to the light shielding layer 111 through the second electrode 172, and the structure of connecting the second connection portion 230b of the active layer 230 of the second thin film transistor TR2 to the light shielding layer 211 through the second electrode 272 may be applied to the thin film transistor arrays 200, 300, and 400 according to the present disclosure.

Figure 6:
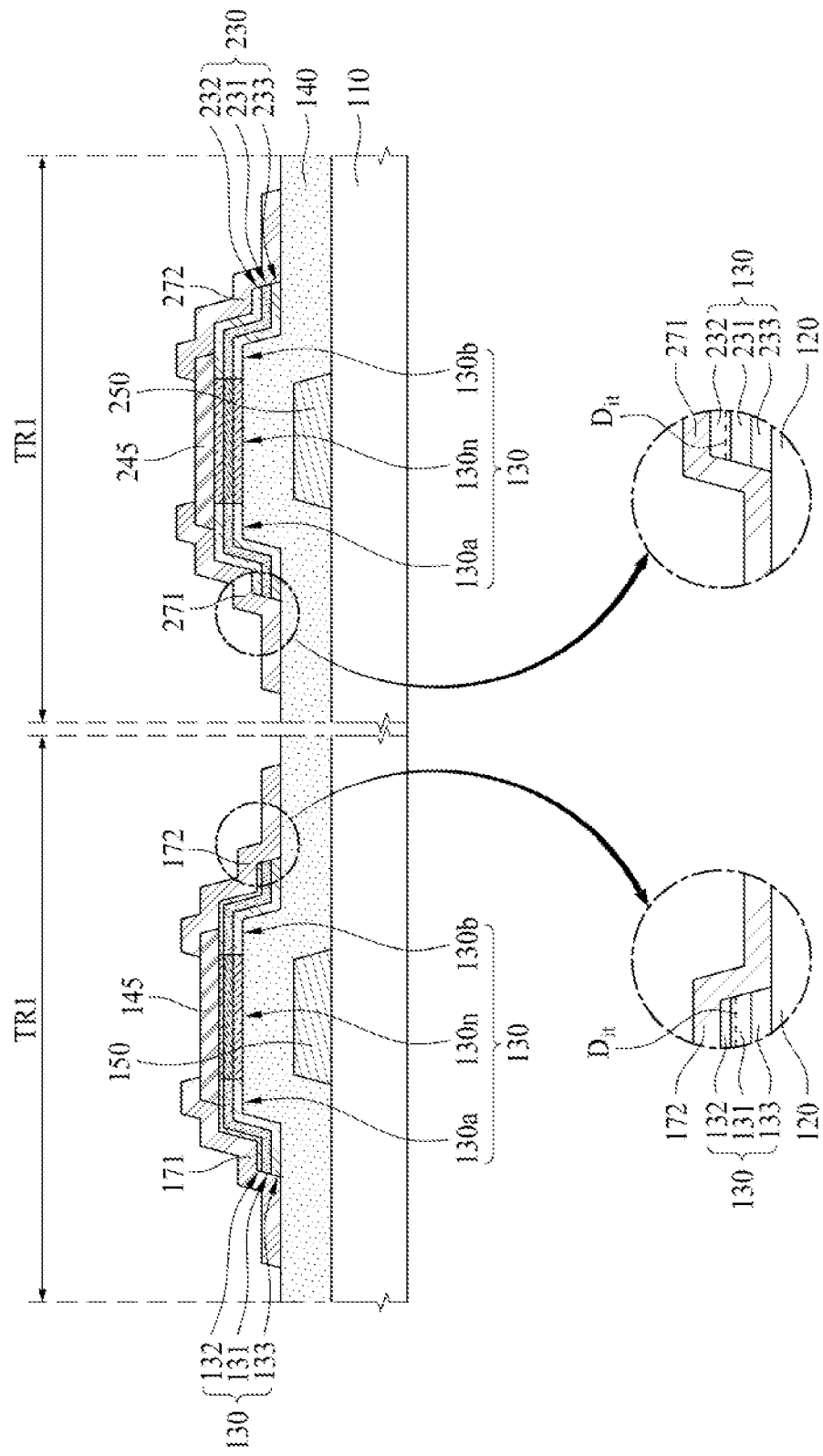

FIG. 6 is a cross sectional view of a thin film transistor array according to another aspect of the present disclosure.

Referring to FIG. 6, the thin film transistor array 600 according to another aspect of the present disclosure may include a substrate 100, and a first thin film transistor TR1 and a second thin film transistor TR2 on the substrate 100, wherein each of the first thin film transistor TR1 and the second thin film transistor TR2 may be formed in a bottom gate structure where a gate electrode 150 and 250 is disposed under an active layer 130 and 230. The first thin film transistor TR1 includes an etch stopper 145, and the second thin film transistor TR2 may include an etch stopper 245. The etch stopper 145 and 245 may overlap with at least a portion of the active layer 130 and 230 in the thin film transistor of the bottom gate structure, and the etch stopper may prevent the active layer 130 and 230 from being damaged for a process of patterning a first electrode 171 and 271 and a second electrode 172 and 272 of the first and second thin film transistors TR1 and TR2.

In the first thin film transistor TR1, the active layer 130 having a channel portion 130n, a first connection portion 130a, and a second connection portion 130b includes first to third oxide semiconductor layers 131, 132, and 133. There are a gate electrode 150 under the active layer 130, a gate insulating film 140 between the gate electrode 150 and the active layer 130, the first electrode 171 connected to the first connection portion 130a, and the second electrode 172 connected to the second connection portion 130b.

In the second thin film transistor TR2, the active layer 230 having a channel portion 230n, a first connection portion 230a, and a second connection portion 230b includes first to third oxide semiconductor layers 231, 232, and 233. There are a gate electrode 250 under the active layer 230, a gate insulating film 140 between the gate electrode 250 and the active layer 230, the first electrode 271 connected to the first connection portion 230a, and the second electrode 272 connected to the second connection portion 230b.

A detailed structure of the active layer 130 of the first thin film transistor TR1 and the active layer 230 of the second thin film transistor TR2 in the thin film transistor array 600 according to another aspect of the present disclosure is identical to that of the active layer 130 of the first thin film transistor TR1 and the active layer 230 of the second thin film transistor TR2 in the thin film transistor array 400 described in FIG. 4, whereby the same reference numerals are assigned to the same parts, and a duplicate description thereof will be omitted.

Also, the active layer 130 of the first thin film transistor TR1 and the active layer 230 of the second thin film transistor TR2 of the thin film transistor array 600 shown in FIG. 6 may be identical in structure to each active layer of the above-described thin film transistor arrays 200, 300, and 400.

FIGS. 7A to 7F illustrate a fabrication method of the thin film transistor array according to the aspect of the present disclosure.

Figure 7A:
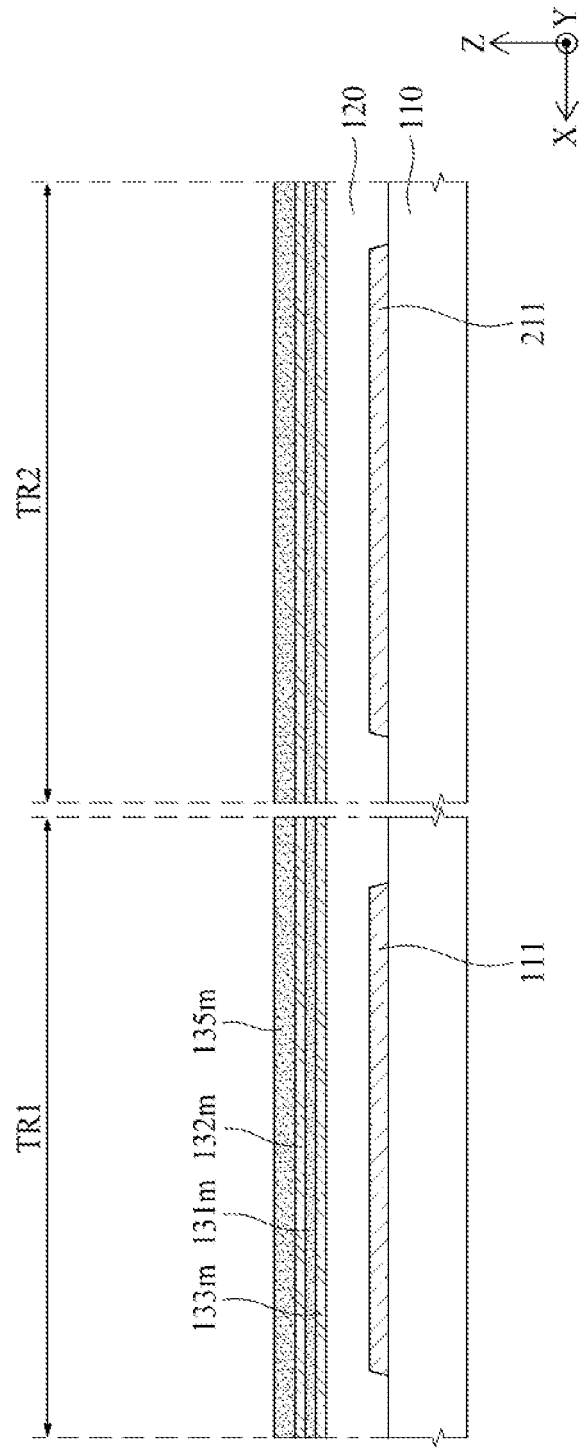

Referring to FIG. 7A, the light shielding layers 111 and 211 are respectively formed at positions corresponding to the first thin film transistor TR1 and the second thin film transistor TR2 on the substrate 110. Then, the buffer layer 120 is commonly formed on the substrate 110 and the light shielding layers 111 and 211. Next, a third oxide semiconductor material layer 133m, a first oxide semiconductor material layer 131m, and a second oxide semiconductor material layer 132m are sequentially formed. The first oxide semiconductor material layer 131m may include an oxide semiconductor material having a large mobility for use as a main active layer. The second oxide semiconductor material layer 132m and the third oxide semiconductor material layer 133m may include an oxide semiconductor material having excellent film stability and mechanical stability. Then, a copper material layer 135m is formed on the third oxide semiconductor material layer 133m.

The copper material layer 135m includes copper Cu. For example, the copper material layer 135m may be prepared by a sputtering process, however, a method of preparing the copper material layer 135m is not limited thereto.

For example, the copper material layer 135m may have a thickness of 2 nm to 5 nm.

Referring to FIG. 7B, a photoresist pattern PR is formed only in a portion corresponding to the second thin film transistor TR2, and a first etching process is carried out. The copper material layer 135m on the second oxide semiconductor material layer 132m of the first thin film transistor TR1 may be etched by the first etching process, and the remaining copper material 137m may remain on the second oxide semiconductor material layer 132m or within the second oxide semiconductor material layer 132m. Herein, the remaining copper material 137m may be copper ions. For example, the first etching process may be a wet etching process.

According to the fabrication method of the thin film transistor according to the present disclosure, the copper material layer 135m may be removed by an etching process. At this time, when the copper material layer 135m is etched, at least a portion of the active material layer adjacent to the copper material layer 135m may be etched together with the copper material layer 135m. In FIG. 7B, after the second oxide semiconductor material layer 132m of the first thin film transistor TR1 is exposed to the etching process, at least a portion of the second oxide semiconductor material layer 132m of the first thin film transistor TR1 may be thinner.

An etchant used in the first etching process may be generally prepared from a material having a high etch selectivity to a metal material. Thus, when the first to third oxide semiconductor material layers 131m, 132m, and 133m of the first thin film transistor TR1 and the second thin film transistor TR2 are exposed to the etchant used in the first etching process, the first to third oxide semiconductor material layers 131m, 132m, and 133m may be rarely etched or etched at a low etch rate.

Figure 7C:
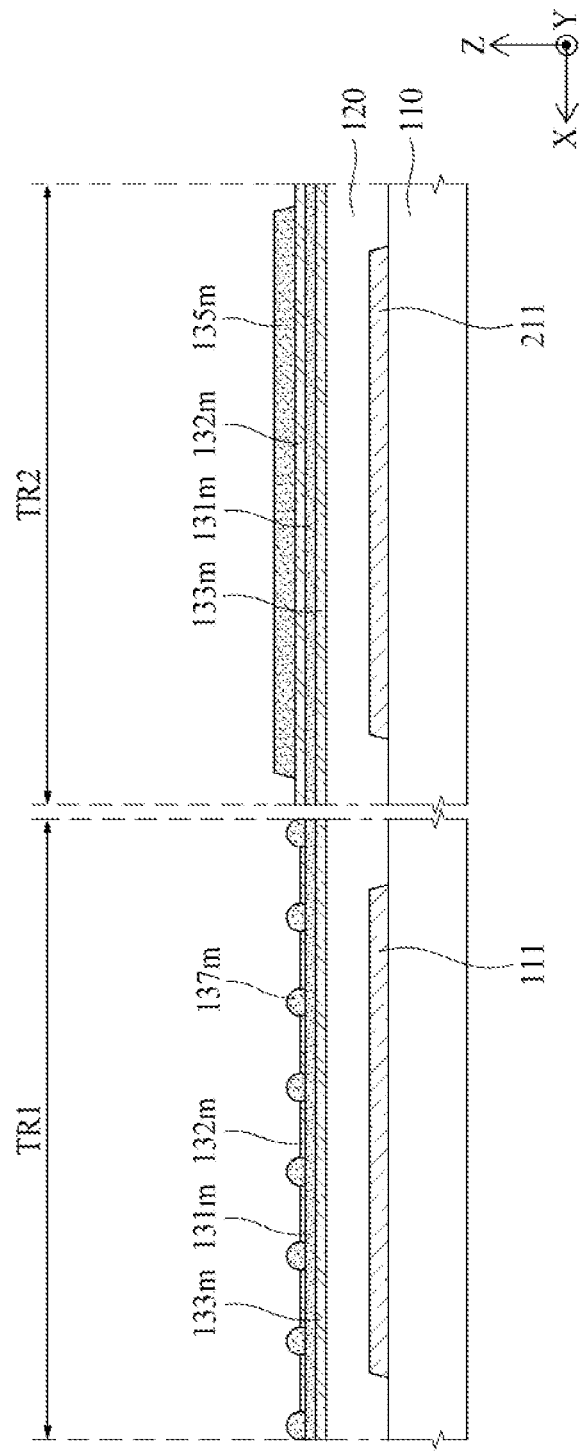

Referring to FIG. 7C, the photoresist pattern PR covering the second thin film transistor TR2 is removed.

Figure 7D:
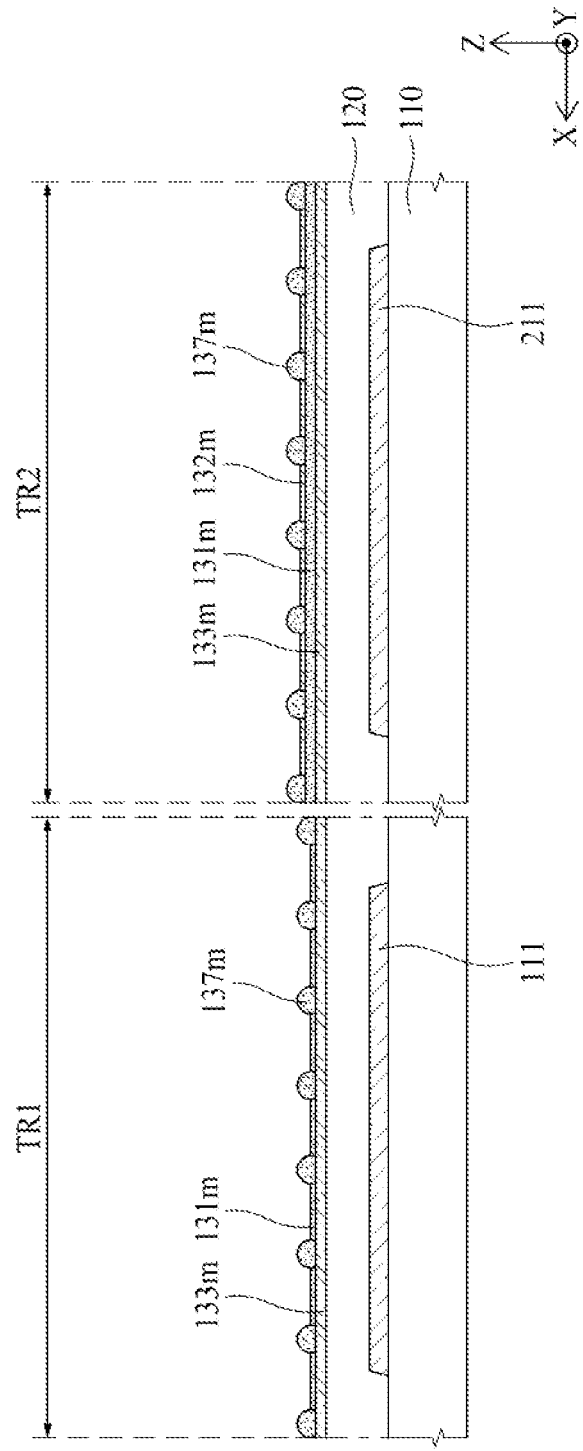

Referring to FIG. 7D, a second etching process may be carried out to the first thin film transistor TR1 and the second thin film transistor TR2. The second oxide semiconductor material layer 132m of the first thin film transistor TR1 may be removed by the second etching process, and at least a portion of the second oxide semiconductor material layer 132m of the second thin film transistor TR2 may be removed. After the second etching process, the remaining copper material 137m may remain in the surface of the first oxide semiconductor material layer 131m of the first thin film transistor TR1 or in the first oxide semiconductor material layer 131m of the first thin film transistor TR1, and the remaining copper material 137m may remain in the surface of the second oxide semiconductor material layer 132m of the second thin film transistor TR2 or in the second oxide semiconductor material layer 132m of the second thin film transistor TR2.

An etchant used in the second etching process may be generally prepared from a material having a high etch selectivity to a metal material. Thus, when the first to third oxide semiconductor material layers 131m, 132m, and 133m of the first thin film transistor TR1 and the second thin film transistor TR2 are exposed to the etchant used in the second etching process, the first to third oxide semiconductor material layers 131m, 132m, and 133m may be rarely etched or etched at a low etch rate.

Referring to FIG. 7E, the first oxide semiconductor material layer 131m and the remaining copper material 137m of the first thin film transistor TR1 and the second oxide semiconductor material layer 132m and the remaining copper material 137m of the second thin film transistor TR2 are heat-treated. The remaining copper material 137m may be diffused into the first oxide semiconductor material layer 131m of the first thin film transistor TR1 and may be diffused into the second oxide semiconductor material layer 132m of the second thin film transistor TR2. As described above, the remaining copper material 137m may be copper ions, and may include monovalent ions $Cu^+$ state or divalent ions $Cu^{2+}$ state. When the heat treatment is performed, copper ions may be primarily present in a divalent ion $Cu^{2+}$ state. According to the aspect of the present disclosure, copper Cu may be present in a copper oxide of CuO by a combination with oxygen in a divalent ion $Cu^{2+}$ state.

The copper Cu combined with oxygen may exhibit an effect such as a formation of an artificial defect in the first oxide semiconductor layer 131. The copper Cu inducing this defect may form an acceptor like trap, thereby increasing the S-factor of the thin film transistor.

Figure 7F:
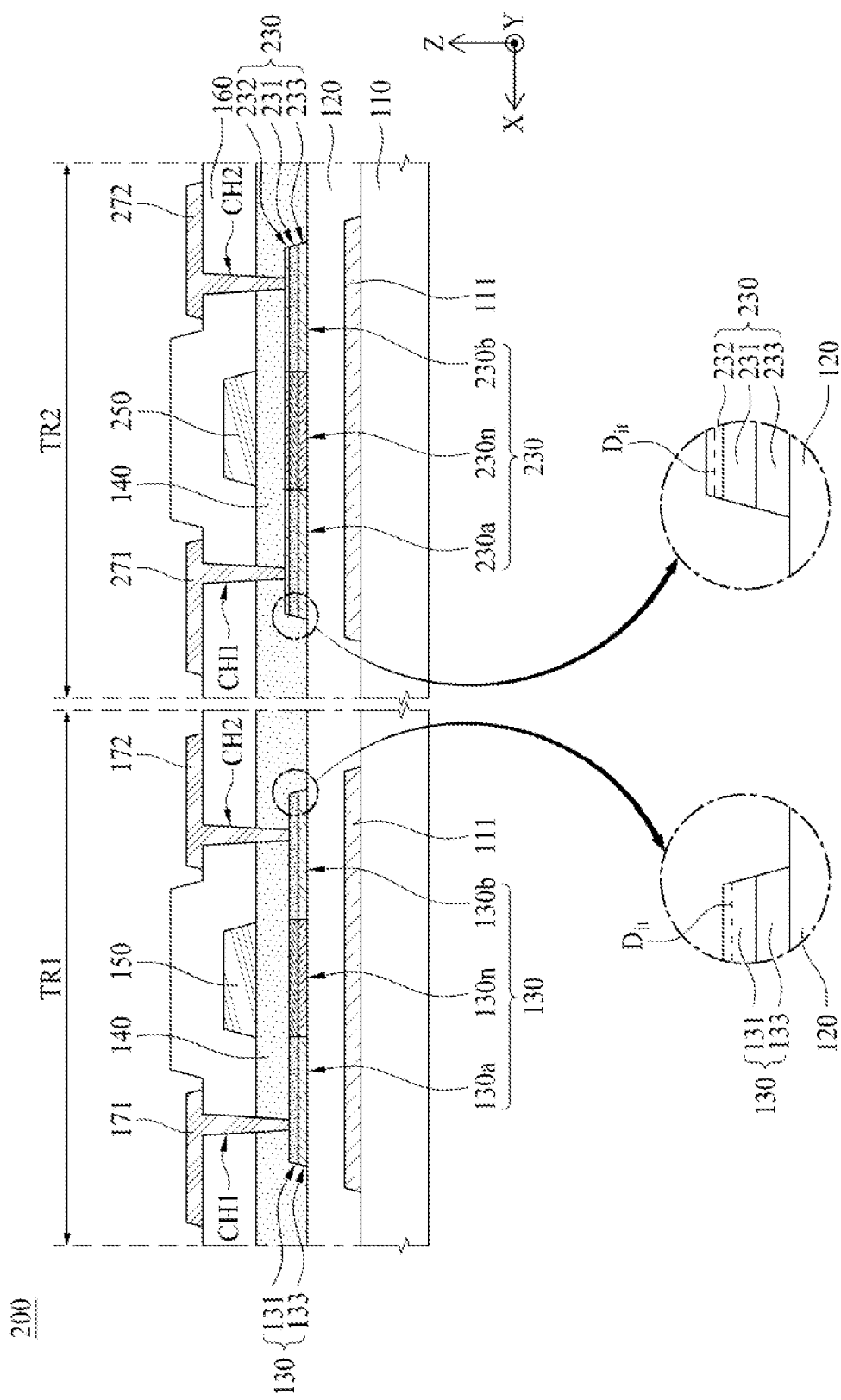

Referring to FIG. 7F, the active layers 130 and 230 are patterned, and the gate insulating film 140 is formed on the active layers 130 and 230. Then, the gate electrode 150 of the first thin film transistor TR1 and the gate electrode 250 of the second thin film transistor TR2 are disposed on the gate insulating film 140. The gate electrodes 150 and 250 overlap with the channel portions 130n and 230n of the active layers 130 and 230. The interlayer insulating film 160 is disposed on the gate electrodes 150 and 250 and the gate insulating film 140. The first electrodes 171 and 271 and the second electrodes 172 and 272 are disposed on the interlayer insulating film 160, and the first electrodes 171 and 271 and the second electrodes 172 and 272 are connected to the active layers 130 and 230 through the first and second contact holes CH1 and CH2, respectively. The second thin film transistor TR2 and the first thin film transistor TR1 may be formed by the same process. As a result, the thin film transistor array 200 according to the aspect of the present disclosure may be fabricated.

Figure 8A:
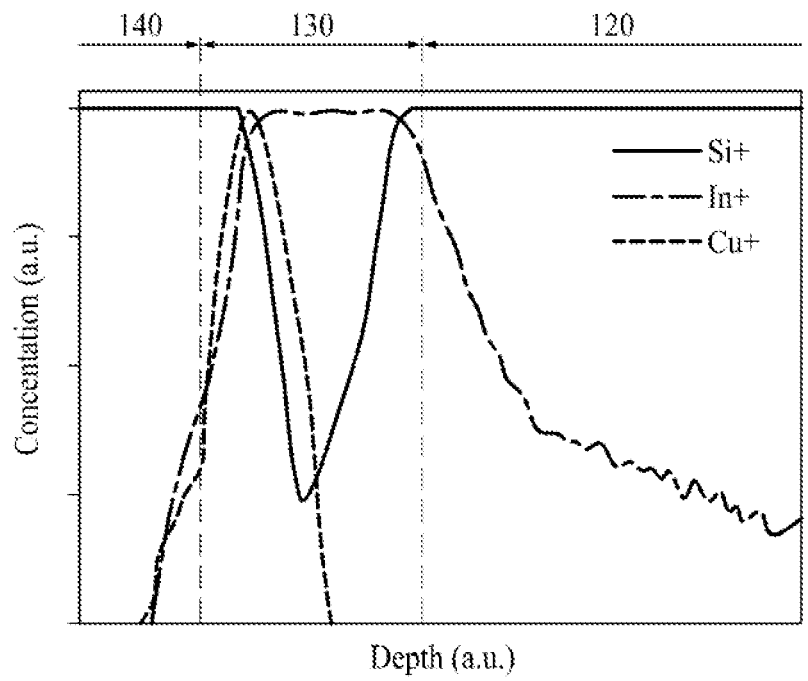
FIG. 8A shows an ion concentration according to a depth after depositing a copper material layer on an active layer.
Figure 8B:
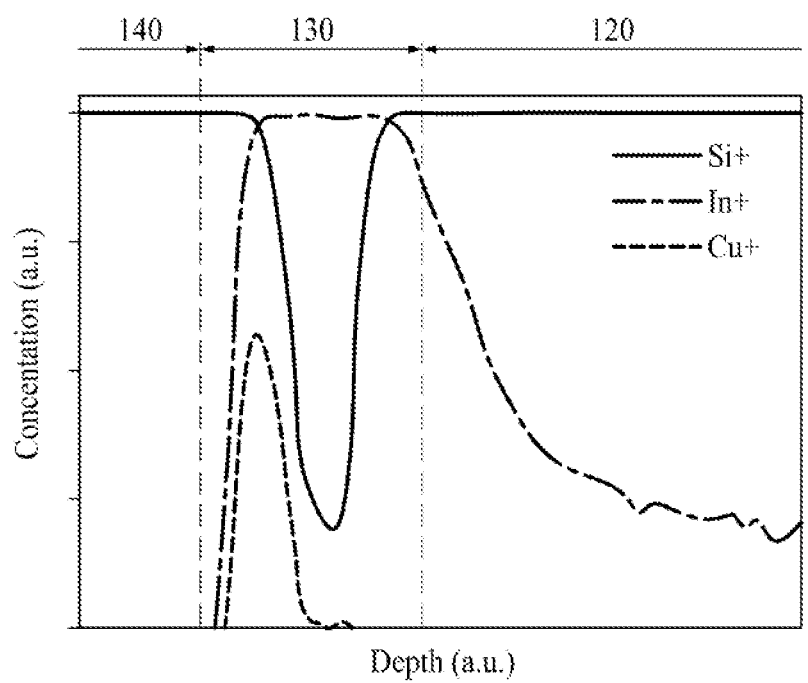
FIG. 8B shows an ion concentration after depositing and removing the copper material layer on the active layer.

FIG. 8A shows the ion concentration according to the depth after depositing the copper material layer on the active layer, and FIG. 8B shows the ion concentration after depositing and removing the copper material layer on the active layer. In FIGS. 8A and 8B, each ion concentration may be measured by SIMS or ToF-SIMS (Time of Flight Secondary Ion Mass Spectrometry). In FIGS. 8A and 8B, a silicon oxide buffer layer 120 and an IGZO oxide active layer 130 are formed on the substrate to measure each ion concentration, a copper material layer is formed at a thickness of about 3 nm on the active layer 130, and the copper material layer is removed by the etching process. In FIGS. 8A and 8B, the horizontal axis is the depth from the surface of the gate insulating film 140, the vertical axis is the concentration, and the value of each graph represents an arbitrary unit or a relative value.

Referring to FIGS. 8A and 8B, it shows that the concentration of silicon and indium according to the depth is not significantly different between the state after deposition of the copper material layer and the state after removal of the copper material layer by the etching process. However, before the etching process is carried out, the copper according to the depth is distributed in a relatively wide area on the boundary between the gate insulating film 140 and the active layer 130, and the concentration is relatively high on the boundary between the gate insulating film 140 and the active layer 130. Meanwhile, after the etching process is carried out, the distribution area of copper is reduced to half, and the concentration level of copper is reduced by about 2 order. Referring to FIGS. 8A and 8B in connection with FIG. 7D, even after performing the etching process, the copper material layer 135m remains in the active layer or the surface of the active layer as the remaining copper material 137m.

Figure 9A:
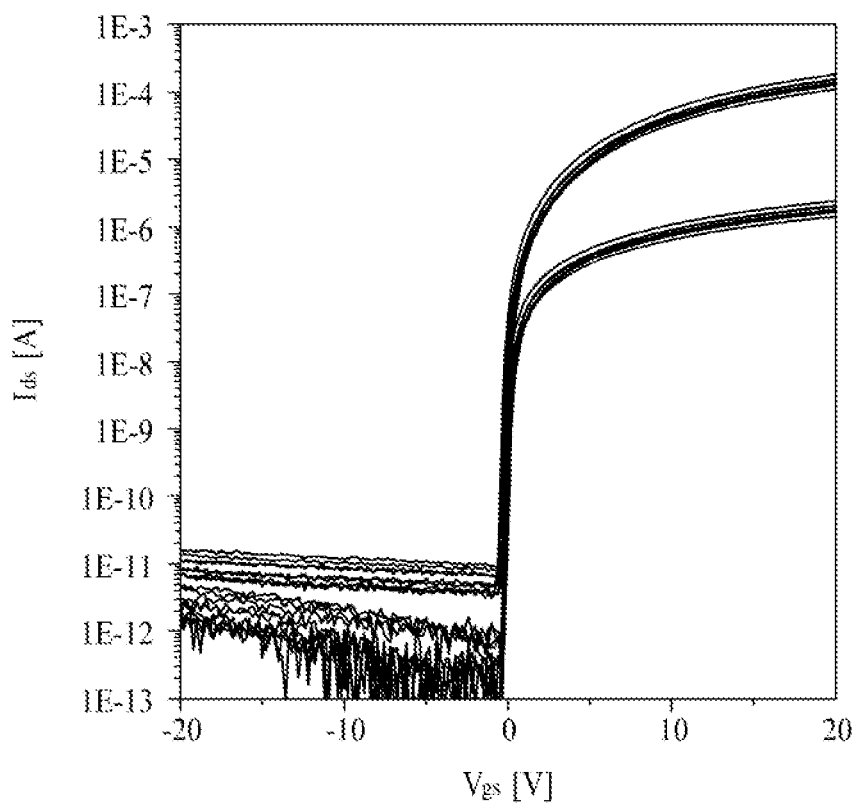
FIGS. 9A to 9C are threshold voltage graphs of the thin film transistor according to an aspect of the present disclosure.
Figure 9B:
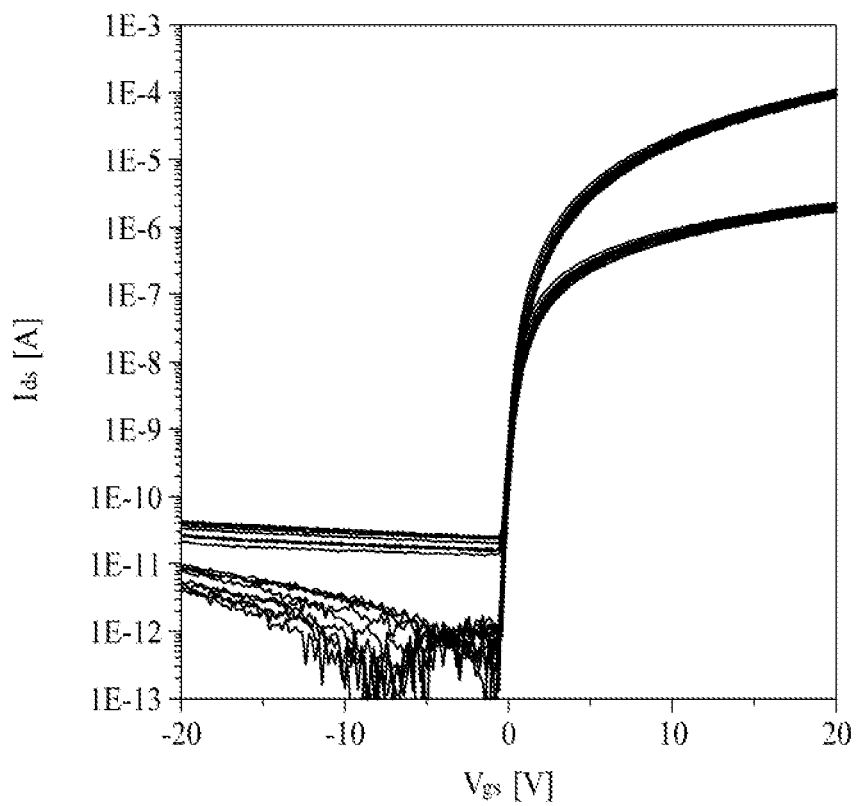
Figure 9C:
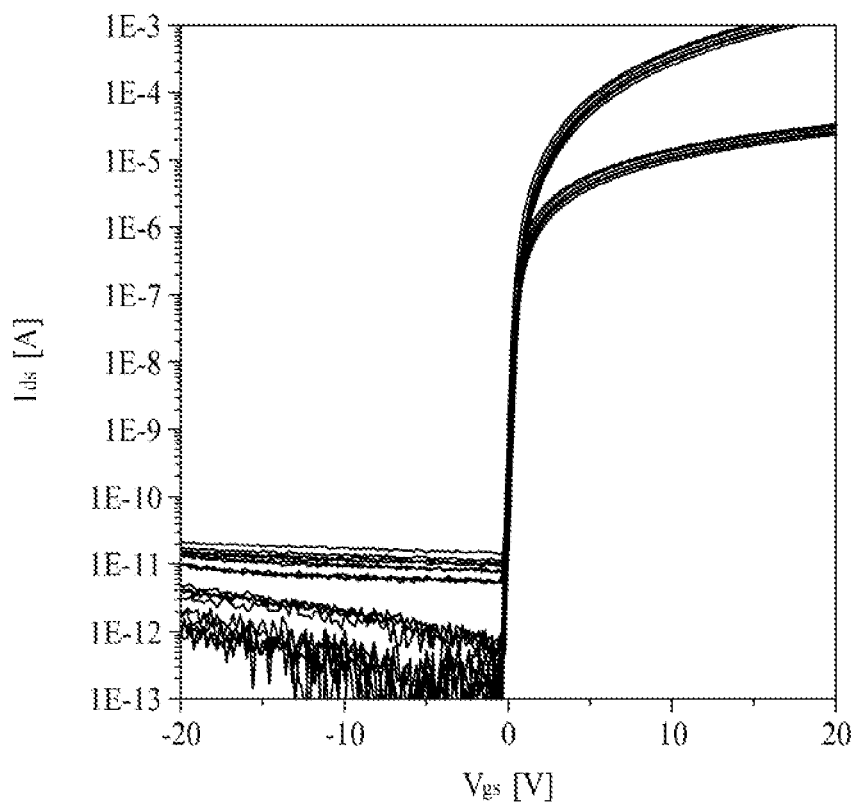

FIGS. 9A to 9C are threshold voltage graphs of the thin film transistor according to one aspect of the present disclosure. The threshold voltage graph for the thin film transistors of FIGS. 9A to 9C is represented by a graph of a drain-to-source current $I_{ds}$ for a gate voltage $V_{gs}$.

The thin film transistor shown in FIG. 9A may have the same structure as the second thin film transistor TR2 of the thin film transistor array 300 shown in FIG. 3, and the width of the channel portion of the active layer of the second thin film transistor TR2 is set to 10 μm, and the length thereof is set to be 6 μm. Accordingly, the thin film transistor shown in FIG. 9A may be composed of the triple oxide semiconductor layer, and the second oxide semiconductor layer 232 may include copper Cu. For example, the thin film transistor in FIG. 9A may be the switching thin film transistor, but aspects of the present disclosure are not limited thereto. The thin film transistor in FIG. 9A has threshold voltage of 0.5 V, mobility of 31.6 $cm^2/Vs$, on-current $I_{on}$ of 9.92 μA, and S-factor of 0.13 V/decade. The thin film transistor in FIG. 9A may be the switching thin film transistor, and the electrical characteristics such as high $I_{on}$ value and low S-factor may be required to drive the switching thin film transistor.

The thin film transistor shown in FIG. 9B may have the same structure as the first thin film transistor TR1 of the thin film transistor array 200 shown in FIG. 2, and the width of the channel portion of the active layer of the first thin film transistor TR1 is set to 10 μm, and the length thereof is set to 6 μm. Accordingly, the active layer of the thin film transistor shown in FIG. 9B may be the dual oxide semiconductor layer structure including the two oxide semiconductor layers, and the first oxide semiconductor layer 131 may include copper Cu. For example, the thin film transistor shown in FIG. 9B may be the driving thin film transistor, but aspects of the present disclosure are not limited thereto. The thin film transistor in FIG. 9B has threshold voltage of 1.04 V, mobility of 26.57 $cm^2/Vs$, on-current $I_{on}$ of 4.25 μA, and S-factor of 0.32 V/decade. The thin film transistor in FIG. 9B may be the driving thin film transistor, and the electrical characteristics such as threshold voltage shifted to the positive direction and high S-factor may be required to drive the driving thin film transistor.

The thin film transistor shown in FIG. 9C may have the same structure as the second thin film transistor TR2 of the thin film transistor array 400 shown in FIG. 4, and the width of the channel portion of the active layer of the second thin film transistor TR2 is set to 120 μm, and the length thereof is set to 6 μm. Accordingly, the thin film transistor shown in FIG. 9C may be composed of the triple oxide semiconductor layer, and the second oxide semiconductor layer 232 may include copper Cu. For example, the thin film transistor shown in FIG. 9C may be the switching thin film transistor, but aspects of the present disclosure are not limited thereto. The thin film transistor in FIG. 9C has threshold voltage of 0.77 V, mobility of 40.48 $cm^2/Vs$, on-current $I_{on}$ of 80.98 μA, and S-factor of 0.15 V/decade. The thin film transistor in FIG. 9C may be the thin film transistor applied to the gate-in-panel GIP, and the electrical characteristics such as high $I_{on}$ value and low S-factor may be required to drive the thin film transistor applied to the gate-in-panel GIP.

In connection with the results of FIGS. 9A to 9C, in case of the structure of the thin film transistor with the second oxide semiconductor layer 232 of the second thin film transistor TR2 which includes copper Cu, it may have the relatively low S-factor and high driving current $I_{on}$, whereby it may be used as the thin film transistor applied to the gate-in-panel GIP or the switching thin film transistor requiring these electrical characteristics. In case of the structure of the thin film transistor with the first oxide semiconductor layer 131 of the first thin film transistor TR1 which includes copper Cu, it may have the relatively high S-factor and the threshold voltage shifted to the positive direction as compared to that of the thin film transistor shown in FIGS. 9A and 9C, whereby it may be used as the driving thin film transistor requiring these electrical characteristics.

Figure 10:
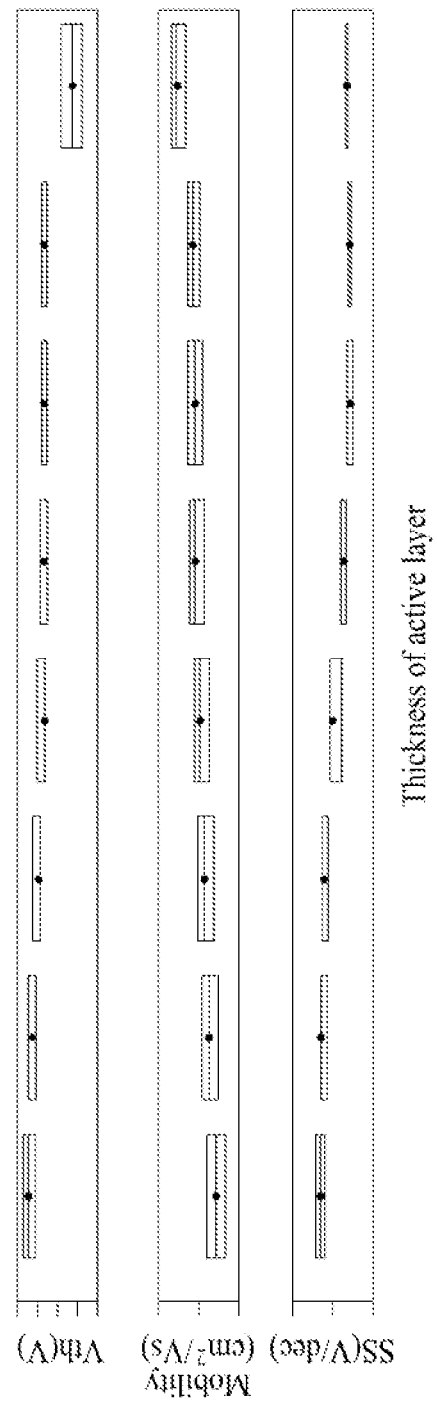
FIG. 10 illustrates a threshold voltage, a mobility, and an S-factor according to a thickness of an oxide semiconductor layer in a thin film transistor according to the present disclosure.

FIG. 10 illustrates the threshold voltage, mobility, and an S-factor according to the thickness of the oxide semiconductor layer of the thin film transistor according to the present disclosure.

Referring to FIG. 10, the threshold voltage decreases according to the increase in the thickness of the oxide semiconductor layer, and the mobility increases according to the decrease of threshold voltage and the increase in the thickness of the oxide semiconductor layer. Also, the S-factor may be generally decreased according to the increase in the thickness of the oxide semiconductor layer.

Figure 11:
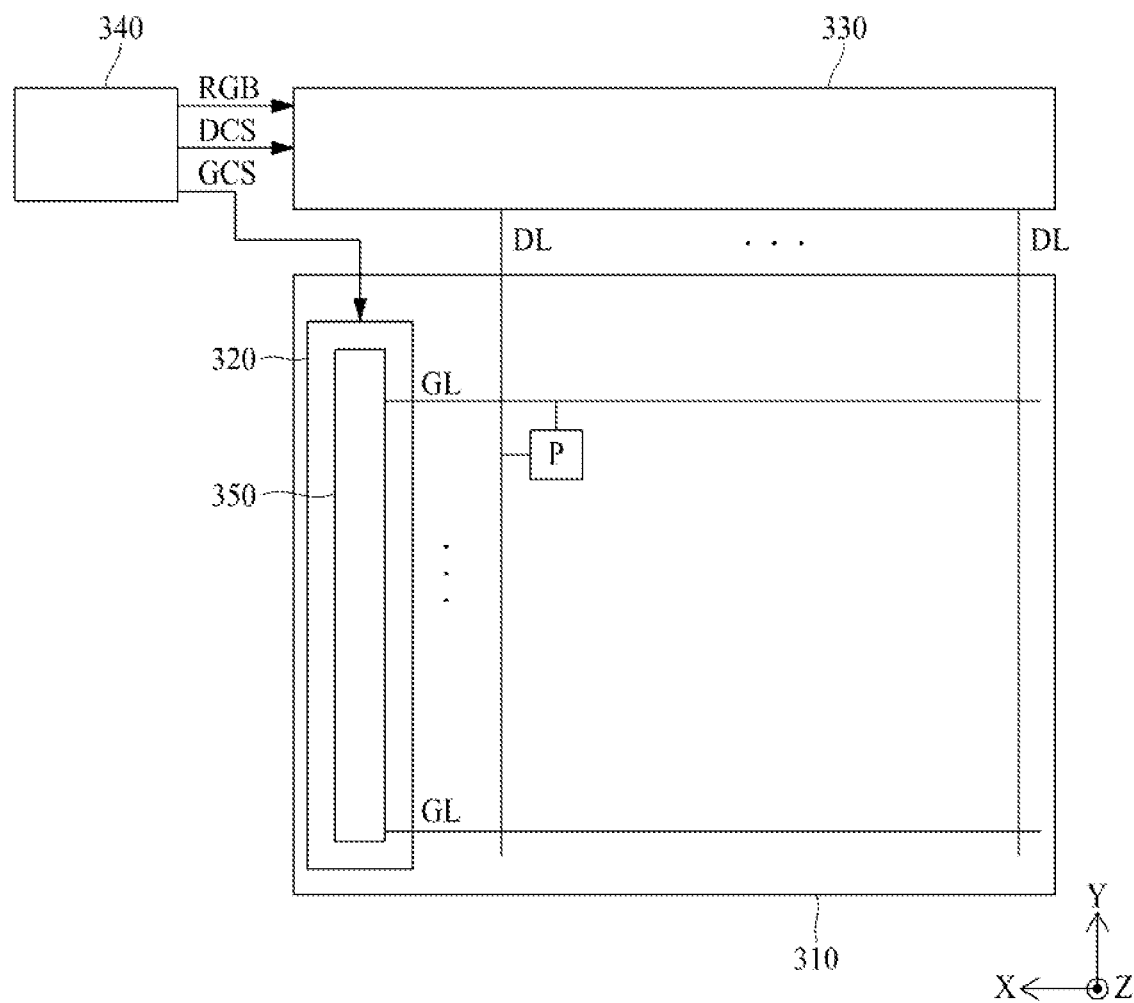
FIG. 11 is a schematic diagram of a display apparatus according to another aspect of the present disclosure.

FIG. 11 is a schematic diagram of a display apparatus according to another aspect of the present disclosure.

As shown in FIG. 11, a display apparatus 500 according to another aspect of the present disclosure includes a display panel 310, a gate driver 320, a data driver 330, and a controller 340.

Gate lines GL and data lines DL are disposed on the display panel 310, and pixels P are disposed in respective crossing areas of the gate lines GL and the data lines DL. An image is displayed by driving the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. Specifically, the data driver 330 converts the video data RGB inputted from the controller 340 into an analog data voltage and supplies the data voltage to the data lines DL.

The gate driver 320 may include the shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal SS or Scan.

According to the aspect of the present disclosure, the gate driver 320 may be mounted on a base substrate 110. As described above, a structure in which the gate driver 320 is directly mounted on the base substrate 110 is referred to as a gate-in-panel GIP structure.

Figure 12:
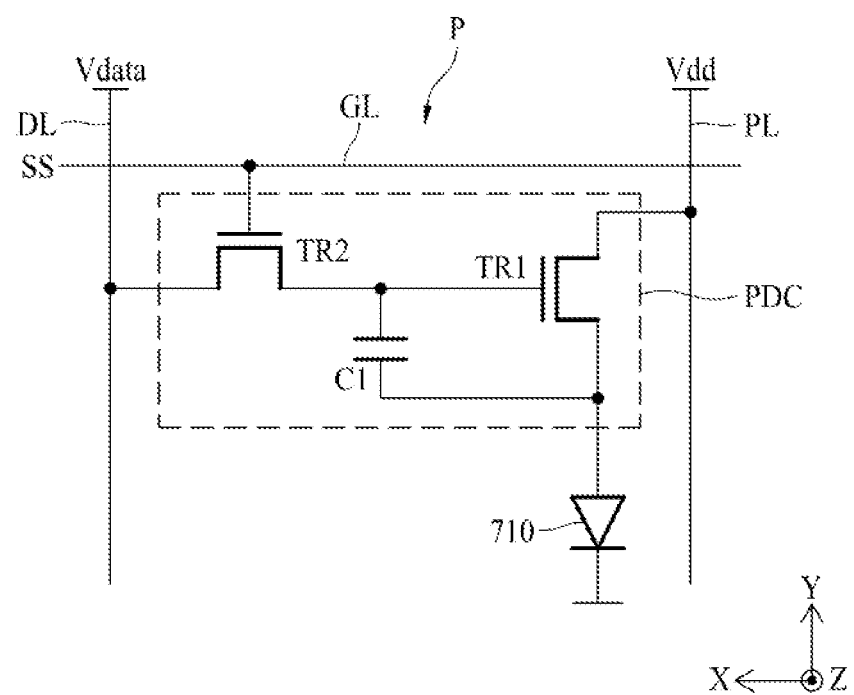
FIG. 12 is a circuit diagram of one pixel P of FIG. 11.
Figure 13:
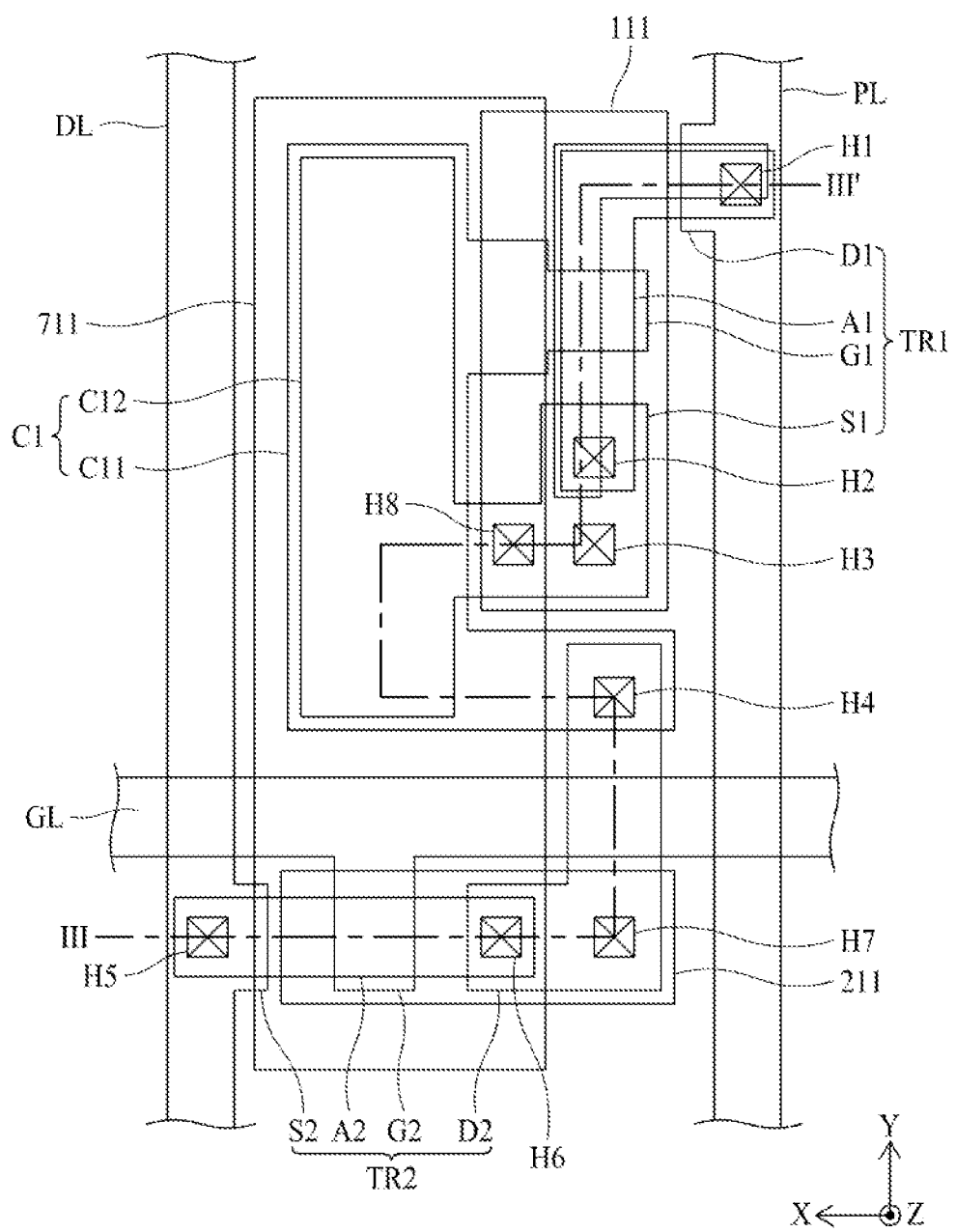
FIG. 13 is a plan view of the pixel P of FIG. 12.
Figure 14:
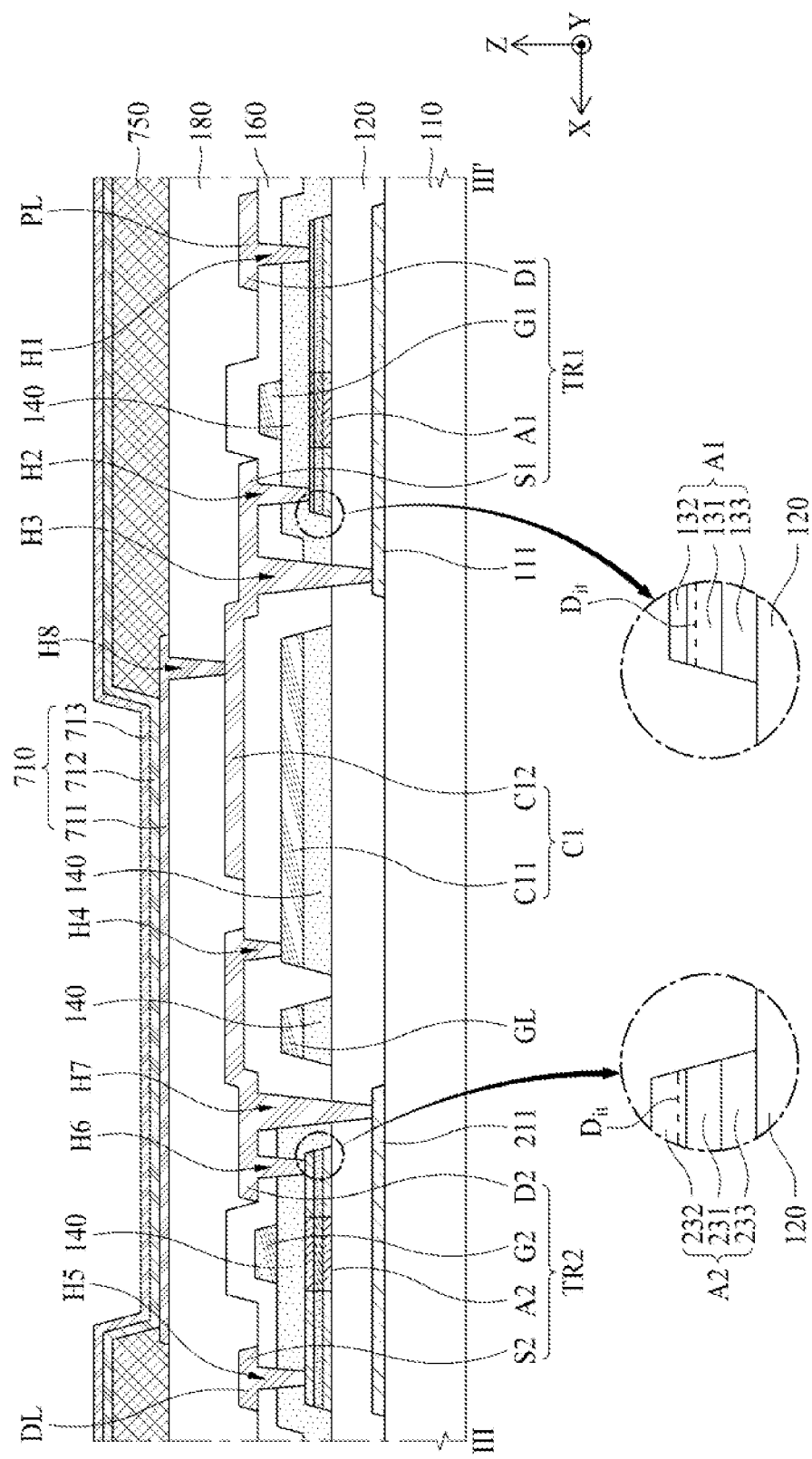
FIG. 14 is a cross-sectional view along line III-III' of FIG. 13.

FIG. 12 is a circuit diagram of one pixel P of FIG. 11, FIG. 13 is a plan view of the pixel P of FIG. 12, and FIG. 14 is a cross sectional view along line III-III' of FIG. 13.

The circuit diagram of FIG. 12 is an equivalent circuit diagram of a pixel P of a display apparatus 500 including an organic light emitting diode OLED. The pixel P includes a display device 710, and a pixel driver PDC for driving the display device 710.

According to another aspect of the present disclosure, the display apparatus 500 includes the pixel driver PDC and the display device 710. The pixel driver PDC includes a first thin film transistor TR1 and a second thin film transistor TR2. The first thin film transistor TR1 may include the thin film transistors 100 and 200 described above.

According to another aspect of the present disclosure, the first thin film transistor TR1 is a driving transistor, and the second thin film transistor TR2 is a switching transistor.

The second thin film transistor TR2 is connected to a gate line GL and a data line DL, and is turned on or off by a scan signal SS supplied through the gate line GL.

The data line DL provides a data voltage Vdata to the pixel driver PDC, and the second thin film transistor TR2 controls the application of the data voltage Vdata.

A driving power line PL provides a driving voltage Vdd to the display device 710, and the first thin film transistor TR1 controls the driving voltage Vdd. The driving voltage Vdd is a pixel driving voltage for driving an organic light emitting diode OLED corresponding to the display device 710.

When the second thin film transistor TR2 is turned on by the scan signal SS applied through the gate line GL from a gate driver (320), the data voltage Vdata supplied through the data line DL is supplied to a gate electrode of the first thin film transistor TR1 connected to the display device 710. The data voltage Vdata is charged to a storage capacitor C1 formed between the gate electrode of the first thin film transistor TR1 and a source electrode of the first thin film transistor TR1.

An amount of current supplied to the organic light emitting diode OLED corresponding to the display device 710 through the first thin film transistor TR1 is controlled by the data voltage Vdata, whereby a grayscale of light emitted from the display device 710 may be controlled.

Referring to FIGS. 13 and 14, the first thin film transistor TR1 and the second thin film transistor TR2 are disposed on a substrate 110.

The substrate 110 may be a glass substrate, a curable or bendable thin film glass substrate, a plastic substrate, or a silicon wafer substrate. If using plastic for the substrate 110, transparent plastic having flexibility, for example, polyimide may be used. If the substrate 110 is formed of polyimide, heat resistant polyimide capable of enduring a high temperature may be used in consideration of a high temperature deposition process on the substrate 110.

Then, light shielding layers 111 and 211 may be disposed on the substrate 110.

The light shielding layers 111 and 211 block the external light being incident from the outside, to thereby protect active layer 130 and the first and second thin film transistors TR1 and TR2. The light shielding layers 111 and 211 may be made of a material having the light blocking characteristics or light reflection characteristics. The light shielding layers 111 and 211 may include a lower light shielding layer and an upper light shielding layer. The light shielding layers 111 and 211 may not be disposed on a whole surface of the substrate 110, but may be disposed on at least a portion overlapping with the thin film transistor TR1 and TR2 or the active layer 130.

A buffer layer 120 is disposed on the light shielding layer 111 and 211 and the substrate 110.

The buffer layer 120 may be formed in a multi-layered structure by depositing at least one of a silicon oxide (SiOx)

film, silicon nitride (SiN) film, and a silicon oxynitride (SiON) film. Other components of the thin film transistor including the gate electrode 150, which will be described later, may be disposed on the buffer layer 120.

The active layer A1 of the first thin film transistor TR1 and the active layer A2 of the second thin film transistor TR2 are disposed on the buffer layer 120.

The active layer A1 of the first thin film transistor TR1 includes the first oxide semiconductor layer 131, the second oxide semiconductor layer 132, and the third oxide semiconductor layer 133, and the active layer A2 of the second thin film transistor TR2 includes the first oxide semiconductor layer 231, the second oxide semiconductor layer 232, and the third oxide semiconductor layer 233.

According to the aspect of the present disclosure, the first oxide semiconductor layer 131 of the first thin film transistor TR1 and the second oxide semiconductor layer 232 of the second thin film transistor TR2 may include copper Cu.

According to one aspect of the present disclosure, the copper Cu may be in an ion state. For example, in the active layer A1 and A2, copper Cu may be in a state of $Cu_2O$ or CuO. When copper Cu is in a state of $Cu_2O$, copper Cu may be referred to as a monovalent ion $Cu^+$ state. When copper Cu is in a state of CuO, copper Cu may be referred to as a divalent ion $Cu^{2+}$ state.

According to one aspect of the present disclosure, "copper Cu" means that it includes both copper atoms and copper ions $Cu^+$ and $Cu^{2+}$.

The copper Cu combined with oxygen may exhibit an effect such as formation of an artificial defect in the first oxide semiconductor layer 131 of the first thin film transistor TR1. The copper Cu inducing this defect forms an acceptor like trap or an interface trap $D_{it}$ so that it is possible to increase an S-factor of the first thin film transistor TR1 of the thin film transistor array 100 according to the present disclosure, and to shift a threshold voltage to a positive direction (+). Generally, "$D_{it}$" is used as a term that represents a density of the interface trap. However, in the present disclosure, "$D_{it}$" is used as a term that indicates a location of a defect by copper Cu. For example, the first thin film transistor TR1 of the thin film transistor array may be a driving thin film transistor, but not limited thereto.

The copper Cu combined with oxygen may exhibit an effect such as formation of an artificial defect in the second oxide semiconductor layer 232 of the second thin film transistor TR2. The copper Cu inducing this defect forms an acceptor like trap or an interface trap $D_{it}$. Thus, it is possible to maintain a low S-factor in the second thin film transistor TR2 of the thin film transistor array, and to raise driving current and mobility. Also, since the second oxide semiconductor layer 232 does not function as a main channel of the active layer 230, the copper Cu of the second oxide semiconductor layer 232 may not correspond to the electrical behavior of the thin film transistor. For example, the second thin film transistor TR2 of the thin film transistor array may be a switching thin film transistor or a gate-in-panel GIP circuit, but not limited thereto.

Also, according to one aspect of the present disclosure, a copper concentration in the first oxide semiconductor layer 131 of the first thin film transistor TR1 may be higher than a copper concentration in the second oxide semiconductor layer 232 of the second thin film transistor TR2.

A thickness of the active layer A2 of the second thin film transistor TR2 of the thin film transistor array 100 according to the present disclosure may be larger than a thickness of the active layer A1 of the first thin film transistor TR1 of the thin film transistor array 100 according to the present disclosure.

A gate insulating film 140 is disposed on the active layer A1 of the first thin film transistor TR1, the active layer A2 of the second thin film transistor TR2 and the buffer layer 120 and is disposed between the active layer A1 of the first thin film transistor TR1 and the gate electrode G1 and between the active layer A2 of the second thin film transistor TR2 and the gate electrode G2, to thereby protect the active layer A1 of the first thin film transistor TR1 and the active layer A2 of the second thin film transistor TR2. The gate insulating film 140 may include a silicon nitride (SiNx) film or a silicon oxide (SiOx) film, but not limited thereto. The gate insulating film 140 may have a single-layered structure or a multi-layered structure.

A first capacitor electrode C11 of a storage capacitor C1 is disposed on the gate insulating film 140. The first capacitor electrode C11 may be connected to the first gate electrode G1 of the first thin film transistor TR1. The first capacitor electrode C11 may be integrated into the first gate electrode G1 of the first thin film transistor TR1 as one body.

The gate electrode G1 of the first thin film transistor TR1 and the gate electrode G2 of the second thin film transistor TR2 are disposed on the gate insulating film 140. The gate electrode G1 of the first thin film transistor TR1 and the gate electrode G2 of the second thin film transistor TR2 overlap with channel portions of the active layers 130 and 230.

The gate electrode G1 of the first thin film transistor TR1 and the gate electrode G2 of the second thin film transistor TR2 may include at least one of aluminum-based metal materials such as aluminum (Al) or aluminum alloys, silver-based metal materials such as silver (Ag) or silver alloys, copper-based metal materials such as copper (Cu) or copper alloys, molybdenum-based metal materials such as molybdenum (Mo) or molybdenum alloys, chromium (Cr), tantalum (Ta), neodymium (Nd), and titanium (Ti). Each of the gate electrode G1 of the first thin film transistor TR1 and the gate electrode G2 of the second thin film transistor TR2 may have a multi-layered structure including at least two conductive layers having the different physical properties.

An interlayer insulating film 160 is disposed on the gate electrode 150 and the gate insulating film 140.

The interlayer insulating film 160 include a silicon oxide (SiOx) film or a silicon nitride film SiNx, and may protect the thin film transistor. In order to contact the active layer A1 of the first thin film transistor TR1 and the active layer A2 of the second thin film transistor TR2 to source and drain electrodes, respectively, a portion of the interlayer insulating film 160 corresponding to a contact hole may be removed. A source electrode S1 and a drain electrode D1 of the first thin film transistor TR1 are disposed on the interlayer insulating film 160, and a source electrode S2 and a drain electrode D2 of the second thin film transistor TR2 are disposed on the interlayer insulating film 160. A data line DL, a driving power line PL, and a second capacitor electrode C12 of the storage capacitor C1 may be disposed on the interlayer insulating film 160.

A portion of the driving power line PL may extend and may be the drain electrode D1 of the first thin film transistor TR1. The drain electrode D1 of the first thin film transistor TR1 is connected to the active layer A1 through a first contact hole H1.

The source electrode S1 of the first thin film transistor TR1 is connected to the active layer A1 through a second contact hole H2, and may be connected to the light shielding layer 111 through a third contact hole H3.

The source electrode S1 of the first thin film transistor TR1 and the second capacitor electrode C12 are connected to each other. The source electrode S1 of the first thin film transistor TR1 and the second capacitor electrode C12 may be integrally formed as one body.

A portion of the data line DL may extend and may be the source electrode S2 of the second thin film transistor TR2. The source electrode S2 of the second thin film transistor TR2 may be connected to the active layer A2 through a fifth contact hole H5.

The drain electrode D2 of the second thin film transistor TR2 may be connected to the active layer A2 through a sixth contact hole H6, and may be connected to the first capacitor electrode C11 through a fourth contact hole H4, and may be connected to the light shielding layer 211 through a seventh contact hole H7.

A planarization layer 180 is disposed on the source electrode S1 and the first drain electrode D1 of the first thin film transistor TR1, the source electrode S2 and the second drain electrode D2 of the second thin film transistor TR2, the data line DL, the driving power line PL, and the second capacitor electrode C12.

The planarization layer 180 is formed of an insulating layer and is configured to planarize upper portions of the first thin film transistor TR1 and the second thin film transistor TR2, and to protect the first thin film transistor TR1 and the second thin film transistor TR2.

A first pixel electrode 711 of the display device 710 is disposed on the planarization layer 180. The first pixel electrode 711 contacts the second capacitor electrode C12 through an eighth contact hole H8 formed in the planarization layer 180. As a result, the first pixel electrode 711 may be connected to the source electrode S1 of the first thin film transistor TR1. The eighth contact hole H8 connected to the first pixel electrode 711 formed in the planarization layer 180 may be formed in a non-opening portion of the display device 710 while being overlapping with a bank layer 750.

The bank layer 750 is disposed at an edge of the first pixel electrode 711. The bank layer 750 defines a light emission area of the display device 710.

An organic light emitting layer 712 is disposed on the first pixel electrode 711, and a second pixel electrode 713 is disposed on the organic light emitting layer 712. Accordingly, the display device 710 is configured. The display device 710 shown in FIGS. 13 and 14 is an organic light emitting diode OLED. Accordingly, the display apparatus 500 according to another aspect of the present disclosure is an organic light emitting display apparatus.

Figure 15:
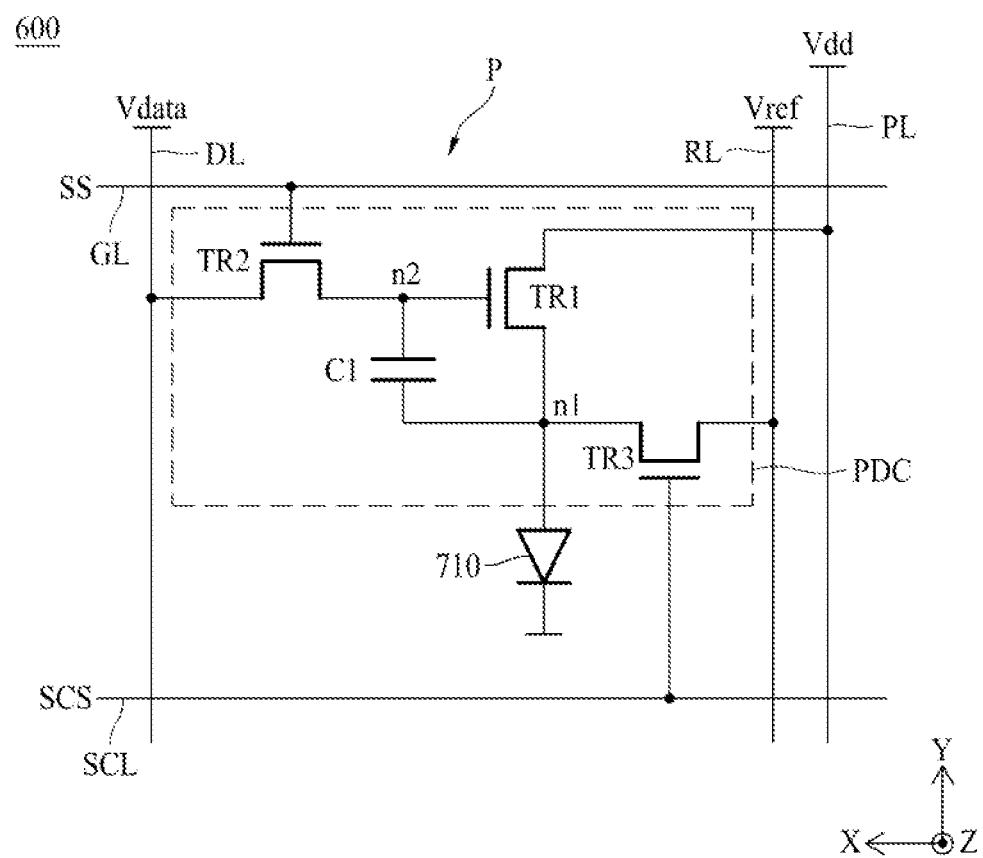
FIGS. 15 and 16 are circuit diagrams of one pixel of a display apparatus according to another aspect of the present disclosure.

FIG. 15 is a circuit diagram of any one pixel of a display apparatus according to another aspect of the present disclosure.

The pixel P of the display apparatus 600 shown in FIG. 15 includes an organic light emitting diode OLED corresponding to a display device 710, and a pixel driver PDC for driving the display device 710. The display device 710 is connected to the pixel driver PDC.

In the pixel P, there are signal lines DL, GL, PL, RL, and SCL to supply a signal to the pixel driver PDC.

A data voltage Vdata is supplied to a data line DL, a scan signal SS is supplied to a gate line GL, a driving voltage Vdd for driving the pixel is supplied to a driving power line PL, a reference voltage Vref is supplied to a reference line RL, and a sensing control signal SCS is supplied to a sensing control line SCL.

For example, the pixel driver PDC includes a second thin film transistor TR2 (switching transistor) connected to the gate line GL and the data line DL, a first thin film transistor TR1 (driving transistor) for controlling a level of current output to the display device 710 according to the data voltage Vdata transmitted through the second thin film transistor TR2, and a third thin film transistor TR3 (reference transistor) for sensing the characteristics of the first thin film transistor TR1.

A storage capacitor C1 is disposed between a gate electrode of the first thin film transistor TR1 and the display device 710.

The second thin film transistor TR2 is turned on by the scan signal SS supplied to the gate line GL, and the turned-on second thin film transistor TR2 transmits the data voltage Vdata supplied to the data line DL to the gate electrode of the first thin film transistor TR1.

The third thin film transistor TR3 is connected to the reference line RL and a first node n1 between the first thin film transistor TR1 and the display device 710, and is turned on or off by the sensing control signal SCS, and senses the characteristics of the first thin film transistor TR1 corresponding to the driving transistor for a sensing period.

A second node n2 connected to the gate electrode of the first thin film transistor TR1 is connected to the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged to the first capacitor C1 formed between the gate electrode and source electrode of the first thin film transistor TR1.

When the first thin film transistor TR1 is turned on, the current is supplied to the display device 710 through the first thin film transistor TR1 by the driving voltage Vdd for driving the pixel, whereby light is emitted from the display device 710.

Figure 16:
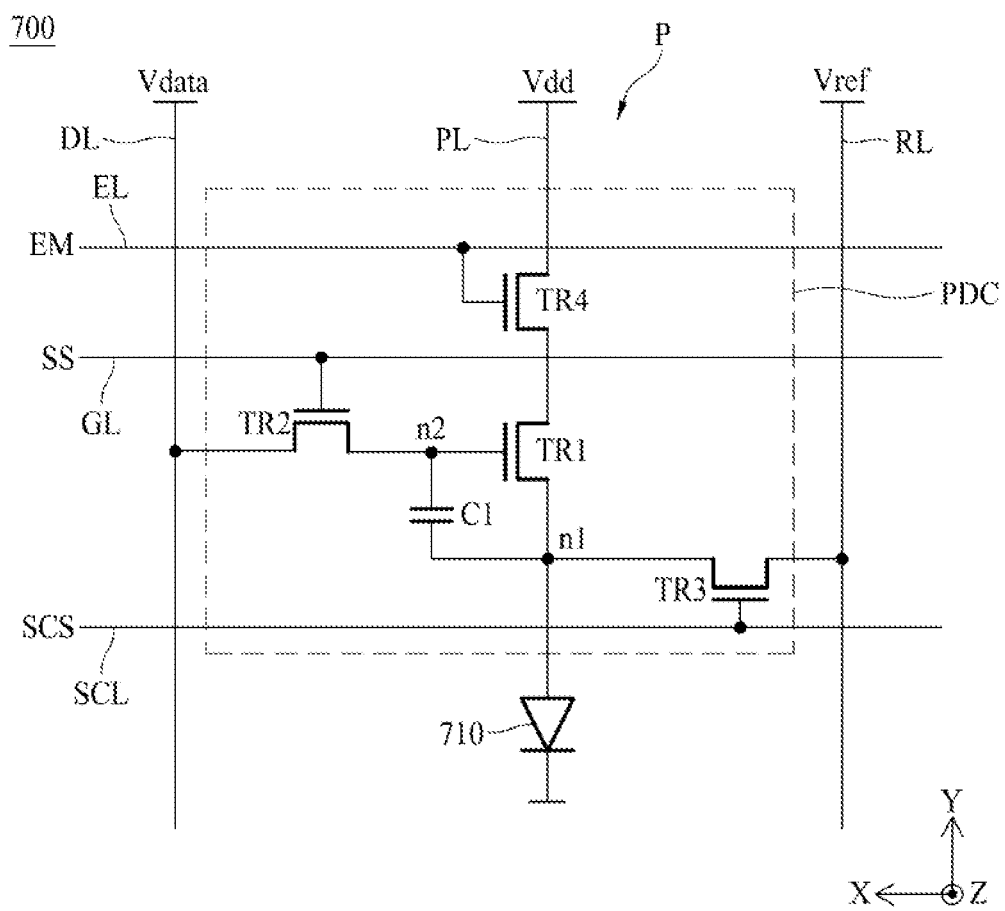

FIG. 16 is a circuit diagram of any one pixel of a display apparatus according to another aspect of the present disclosure.

The pixel P of the display apparatus 700 shown in FIG. 16 includes an organic light emitting diode OLED corresponding to a display device 710, and a pixel driver PDC for driving the display device 710. The display device 710 is connected to the pixel driver PDC.

The pixel driver PDC includes thin film transistors TR1, TR2, TR3, and TR4.

In the pixel P, there are signal lines DL, EL, GL, PL, SCL, and RL to supply a driving signal to the pixel driver PDC.

In comparison to the pixel P of FIG. 15, the pixel P of FIG. 16 further includes an emission control line EL. An emission control signal EM is supplied to the emission control line EL.

Also, in comparison to the pixel driver PDC of FIG. 15, the pixel driver PDC of FIG. 16 further includes a fourth thin film transistor TR4, which is a light emitting control transistor for controlling an emission time point of the first thin film transistor TR1.

A storage capacitor C1 is disposed between a gate electrode of the first thin film transistor TR1 and the display device 710.

The second thin film transistor TR2 is turned on by a scan signal SS supplied to a gate line GL, and transmits a data voltage Vdata supplied to a data line DL to the gate electrode of the first thin film transistor TR1.

The third thin film transistor TR3 is connected to a reference line RL and is turned on or off by a sensing control signal SCS, and senses the characteristics of the first thin film transistor TR1 corresponding to a driving transistor for a sensing period.

The fourth thin film transistor TR4 transfers a driving voltage Vdd to the first thin film transistor TR1 or blocks the driving voltage Vdd according to the emission control signal EM. When the fourth thin film transistor TR4 is turned on, a current is supplied to the first thin film transistor TR1, whereby light is emitted from the display device 710.

The pixel driver PDC according to another aspect of the present disclosure may be formed in various structures in addition to the above-described structures. For example, the pixel driver PDC may include five or more thin film transistors.

Accordingly, the thin film transistor according to one aspect of the present disclosure may improve the S-factor and may adjust the electrical characteristics if needed.

Also, the thin film transistor according to one aspect of the present disclosure may have the defect state in the active layer. Thus, the thin film transistor according to one aspect of the present disclosure having the defect state in the active layer may improve the S-factor and may adjust the electrical characteristics if needed.

According to one aspect of the present disclosure, it is possible to fabricate the first thin film transistor including the second oxide semiconductor layer with the defect state in its surface by providing copper Cu ions in the surface of the active layer, and applying the heat treatment thereto, and the second thin film transistor including the third oxide semiconductor layer, whereby the first thin film transistor may have the improved S-factor, and the second thin film transistor may have the relatively low S-factor and relatively high on-current $I_{on}$ as compared to that of the first thin film transistor.

The first thin film transistor according to one aspect of the present disclosure is used as the driving device of the display apparatus, and the display apparatus including the thin film transistor may realize the great grayscale representation and good picture quality. The second thin film transistor according to one aspect of the present disclosure may be used as the switching device of the display apparatus or the gate-in-panel device, and may have the characteristics of high mobility, low S-factor, and high on-current $I_{on}$.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor array comprising:
a first thin film transistor and a second thin film transistor on a substrate, wherein the first thin film transistor includes:
a first active layer disposed on the substrate; and
a first gate electrode spaced apart from the first active layer and overlapping with at least a portion of the first active layer,
wherein the second thin film transistor includes:
a second active layer disposed on the substrate; and
a second gate electrode spaced apart from the second active layer and overlapping with at least a portion of the second active layer,
wherein the first active layer includes a first main active layer,
the first main active layer includes a first carrier acceptor,
the second active layer includes a second main active layer, and a second interface layer on the second main active layer, and
the second interface layer includes a second carrier acceptor,
wherein the second main active layer has a mobility greater than that of the second interface layer, and the second main active layer includes an oxide semiconductor material different from the second interface layer.

2. The thin film transistor array according to claim 1, wherein each of the first carrier acceptor and the second carrier acceptor includes copper (Cu).

3. The thin film transistor array according to claim 1, wherein the second main active layer has the mobility greater than that of the first main active layer.

4. The thin film transistor array according to claim 1, wherein the first active layer further includes a first interface layer disposed on the first main active layer.

5. The thin film transistor array according to claim 4, wherein the first main active layer has a mobility greater than that of the first interface layer.

6. The thin film transistor array according to claim 1, wherein first active layer further includes a first support layer located between the first main active layer and the substrate.

7. The thin film transistor array according to claim 6, wherein the first main active layer has a mobility greater than that of the first support layer.

8. The thin film transistor array according to claim 1, wherein the second active layer further includes a second support layer located between the second main active layer and the substrate.

9. The thin film transistor array according to claim 8, wherein the second main active layer has the mobility greater than that of the second support layer.

10. The thin film transistor array according to claim 1, wherein the first active layer is disposed between the first gate electrode and the substrate, and the second active layer is disposed between the second gate electrode and the substrate.

11. The thin film transistor array according to claim 1, wherein the first gate electrode is disposed between the first active layer and the substrate, and the second gate electrode is disposed between the second active layer and the substrate.

12. The thin film transistor array according to claim 1, wherein each of the first carrier acceptor and the second carrier acceptor includes $Cu_2O$ and $CuO$.

13. The thin film transistor array according to claim 12, wherein a concentration of $Cu^{2+}$ is higher than a concentration of $Cu^+$ in the first oxide semiconductor layer.

14. The thin film transistor array according to claim 1, wherein the second main active layer does not include copper (Cu).

15. A display apparatus comprising:
a thin film transistor array including a first thin film transistor and a second thin film transistor on a substrate;
wherein the first thin film transistor includes:
a first active layer disposed on the substrate; and
a first gate electrode spaced apart from the first active layer and overlapping with at least a portion of the first active layer, and wherein the second thin film transistor includes:
a second active layer disposed on the substrate; and
a second gate electrode spaced apart from the second active layer and overlapping with at least a portion of the second active layer,
wherein the first active layer includes a first main active layer,
the first main active layer includes a first carrier acceptor,
the second active layer includes a second main active layer, and a second interface layer on the second main active layer, and
the second interface layer includes a second carrier acceptor,
wherein the second main active layer has a mobility greater than that of the second interface layer, and the second main active layer includes an oxide semiconductor material different from the second interface layer.

16. The display apparatus according to claim 15, wherein the first thin film transistor is a switching transistor, and the second thin film transistor is a driving transistor.

17. The display apparatus according to claim 15, wherein each of the first carrier acceptor and the second carrier acceptor includes copper (Cu).

\* \* \* \* \*